(12) United States Patent
Liu et al.

(10) Patent No.: US 12,040,353 B2
(45) Date of Patent: Jul. 16, 2024

(54) MULTI-TIER DEEP TRENCH CAPACITOR AND METHODS OF FORMING THE SAME

(71) Applicant: Taiwan Semiconductor Manufacturing Company Limited, Hsinchu (TW)

(72) Inventors: Tao-Cheng Liu, Hsinchu (TW); Ying-Hsun Chen, Taoyuan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 357 days.

(21) Appl. No.: 17/458,961

(22) Filed: Aug. 27, 2021

(65) Prior Publication Data

US 2023/0066352 A1    Mar. 2, 2023

(51) Int. Cl.
   *H01L 23/522*   (2006.01)
   *H01G 4/30*    (2006.01)
   *H01G 4/35*    (2006.01)
   *H01L 49/02*   (2006.01)

(52) U.S. Cl.
   CPC .......... *H01L 28/91* (2013.01); *H01G 4/30* (2013.01); *H01G 4/35* (2013.01); *H01L 23/5223* (2013.01)

(58) Field of Classification Search
   CPC ......... H01G 4/30; H01G 4/35; H01L 23/5223
   See application file for complete search history.

(56) References Cited

U.S. PATENT DOCUMENTS

| | | | |
|---|---|---|---|
| 11,417,628 B2 * | 8/2022 | Chen | H10B 12/036 |
| 2010/0052099 A1 | 3/2010 | Chang et al. | |
| 2012/0061798 A1 * | 3/2012 | Wong | H01L 29/945 257/532 |
| 2012/0080772 A1 | 4/2012 | Asami et al. | |
| 2016/0020267 A1 * | 1/2016 | Lin | H01L 29/945 257/532 |
| 2017/0053979 A1 | 2/2017 | Voiron et al. | |
| 2017/0213650 A1 * | 7/2017 | Fishburn | H01G 4/12 |
| 2018/0366537 A1 * | 12/2018 | Liu | H01L 27/0805 |
| 2019/0245031 A1 * | 8/2019 | Lin | H01L 28/91 |
| 2020/0091063 A1 * | 3/2020 | Chen | H01L 25/0657 |

(Continued)

OTHER PUBLICATIONS

Taiwan Patent Office; Application No. 111116692 Office Action dated Apr. 13, 2023, 4 pages.

*Primary Examiner* — Eugene Lee

(74) *Attorney, Agent, or Firm* — The Marbury Law Group, PLLC

(57) ABSTRACT

A first-tier capacitor assembly is formed, which includes a first alternating layer stack embedded within a first substrate and including at least two first metallic electrode layers interlaced with at least one first node dielectric layer, and first metallic bonding pads located on a first front surface. A second-tier capacitor assembly is formed, which includes a second alternating layer stack embedded within a second substrate and including at least two second metallic electrode layers interlaced with at least one second node dielectric layers, and second metallic bonding pads located on a second backside surface. The second metallic bonding pads are bonded to the first metallic bonding pads such that each of the at least two first metallic electrode layers contacts a respective one of the at least two second metallic electrode layers. A capacitor with increased capacitance is provided.

20 Claims, 19 Drawing Sheets

(56) References Cited

U.S. PATENT DOCUMENTS

2020/0176552 A1*  6/2020  Chang ................. H01L 23/5329
2020/0402903 A1* 12/2020  Chen ....................... H01L 25/16
2021/0005381 A1*  1/2021  Lu ........................... H01L 28/60
2021/0296283 A1*  9/2021  Huang .............. H01L 21/76898
2023/0068578 A1*  3/2023  Yu ....................... H01L 25/0657

* cited by examiner

MULTI-TIER DEEP TRENCH CAPACITOR AND METHODS OF FORMING THE SAME

BACKGROUND

Capacitors are used in semiconductor chips for many applications such as power supply stabilization. However, a significant amount of device area is often used to fabricate such capacitors. Accordingly, capacitors that may provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
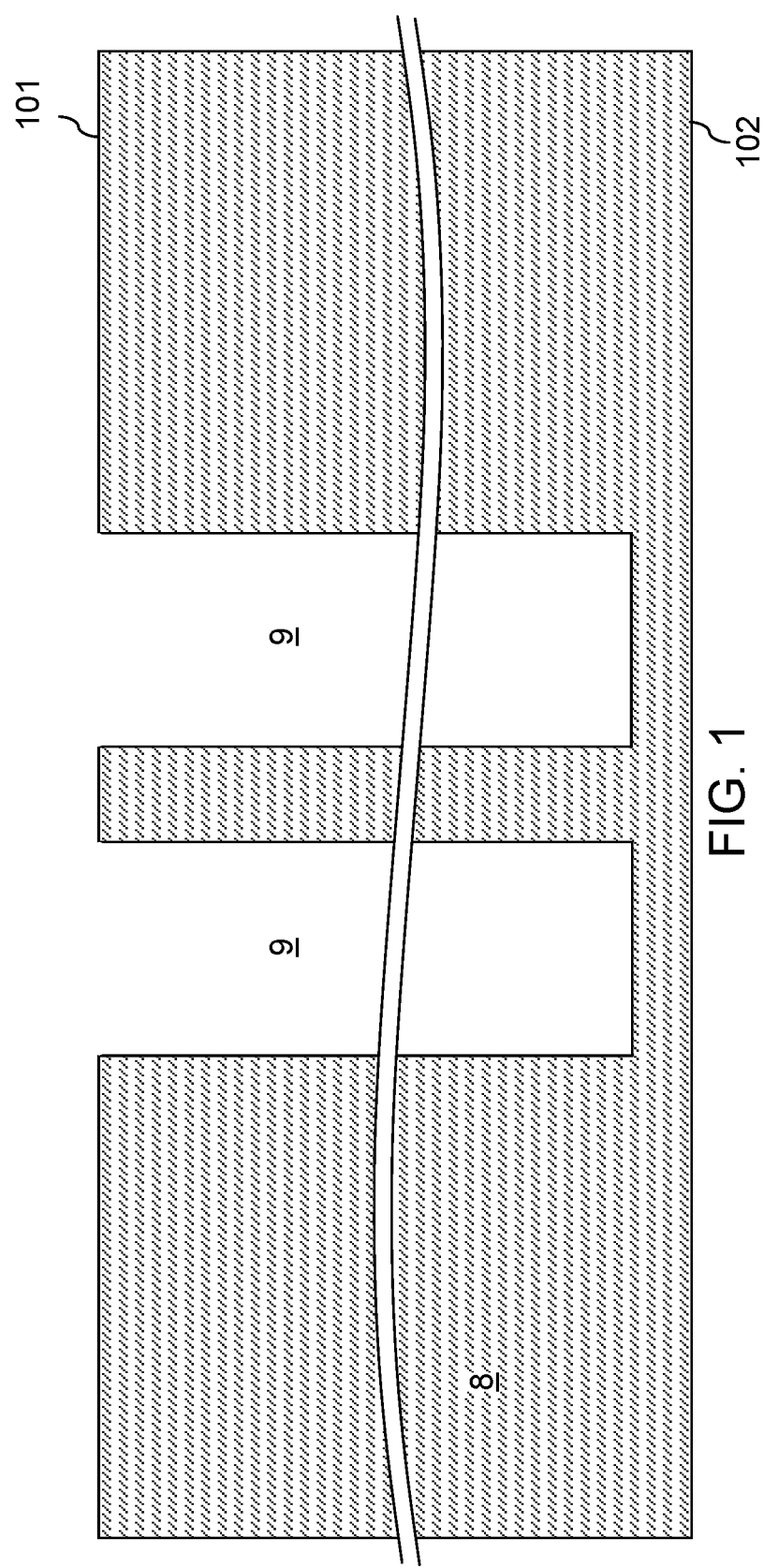
FIG. 1 is a vertical cross-sectional view of a region of a first exemplary structure after formation of deep trenches in a first substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a multi-tier deep trench capacitor and methods of forming the same. Large capacitance capacitors are desired in a power supply circuit for a semiconductor die. A capacitor die including a deep trench capacitor may be attached to the semiconductor die to provide a large capacitance capacitor that is incorporated into the power supply circuit of the semiconductor die. Typically, the lateral dimensions of the capacitor die are less than the lateral dimensions of the semiconductor die, and thus, the capacitance of the deep trench capacitor in the capacitor die is limited. The present disclosure provides a multi-tier deep trench structure in which multiple capacitor assemblies may be stacked on one another to provide a capacitor structure having large capacitance. The various aspects of the present disclosure are now described with reference to various drawings of the present disclosure.

Referring to FIG. 1, a first exemplary structure according to an embodiment of the present disclosure is illustrated, which comprises a first substrate 8 having a planar top surface. The first substrate 8 may be a semiconductor substrate including a semiconductor material, and may have a thickness of at least 10 microns. The first substrate 8 may have a front surface and a backside surface. The front surface of the first substrate 8 is herein referred to as a first front surface 101, and the backside surface of the first substrate 8 is herein referred to as a first backside surface 102. The first front surface 101 may be perpendicular to the first backside surface 102. In one embodiment, the first substrate 8 may include a commercially available semiconductor wafer that may be diced into semiconductor dies after formation of first deep trenches. For example, the first substrate 8 may include a semiconductor substrate including single crystalline silicon and having a thickness in a range from 500 microns to 1,500 microns.

First deep trenches 9 vertically extending into the first substrate 8 may be formed by forming a patterned etch mask layer on the front side surface of the first substrate 8. The pattern in the patterned etch mask layer may be transferred the into an upper portion of the first substrate 8. An optional pad dielectric layer (not shown) such as a silicon oxide pad layer may be formed on the front side surface, i.e., the top surface, of the first substrate 8 prior to formation of the patterned etch mask layer. In an exemplary embodiment, the pad dielectric layer may include a silicon oxide layer having a thickness in a range from 20 nm to 100 nm, although thinner or thicker pad dielectric layer may be used.

The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer, forming a lithographically patterned photoresist layer over the blanket etch mask layer, and by transferring the pattern in the lithographically patterned photoresist layer through the blanket etch mask layer using an anisotropic etch process such as a reactive ion etch process.

An anisotropic etch process may be performed to transfer the pattern in the patterned etch mask layer through an upper portion of the first substrate 8 to form the first deep trenches 9. For example, a reactive ion etch process using a combination of gases including HBr, $NF_3$, $O_2$, and $SF_6$ may be used to form the first deep trenches 9. The depth of the first deep trenches 9 may be in a range from 2 micron to 20 microns, such as from 3 microns to 10 microns. The horizontal cross-sectional shape of each first deep trench 9 may have a shape of a circle, an ellipse, a rectangle, a rounded rectangle, an annulus having an inner periphery and an outer periphery of various shapes, or of any two-dimensional shape that defines an enclosed volume. Generally, at least one first deep trench 9 extending downward from a top surface of the first substrate 8 may be formed in the first substrate 8. The at least one first deep trench 9 may comprise a plurality of first deep trenches 9 having a depth that is greater than 2 microns.

Generally, at least one first deep trench 9 vertically extending from the first front surface 101 toward the first backside surface 102 may be formed. In one embodiment, the at least one first deep trench 9 may be a plurality of deep trenches 9. The total number of deep trenches 9 may be, for example, in a range from 1 to 1,000,000, such as from 1,000 to 10,000, although lesser and greater numbers may also be employed.

In one embodiment, each of the first deep trenches 9 may be laterally elongated with a uniform width. A predominant portion (such as more than 50% of the entire area) of each first deep trench 9 may have a width that is sufficient to accommodate vertically-extending portions of all metallic electrode layers and at least one first node dielectric layer to be subsequently formed. For example, a predominant portion of each first deep trench 9 may have a width that is sufficient to accommodate vertically-extending portions of at least two first metallic electrode layers and at least one first node dielectric layer. In an illustrative example, a predominant portion of each first deep trench 9 may have a width that is in a range from 40 nm to 4,000 nm, such as from 200 nm to 800 nm, although lesser and greater widths may also be used.

The photoresist layer may be removed prior to the anisotropic etch process that forms the first deep trenches 9, or may be consumed during the anisotropic etch process that forms the first deep trenches 9. The patterned etch mask layer and the optional dielectric pad layer may be subsequently removed, for example, by a respective isotropic etch process such as a wet etch process.

Figure 2:
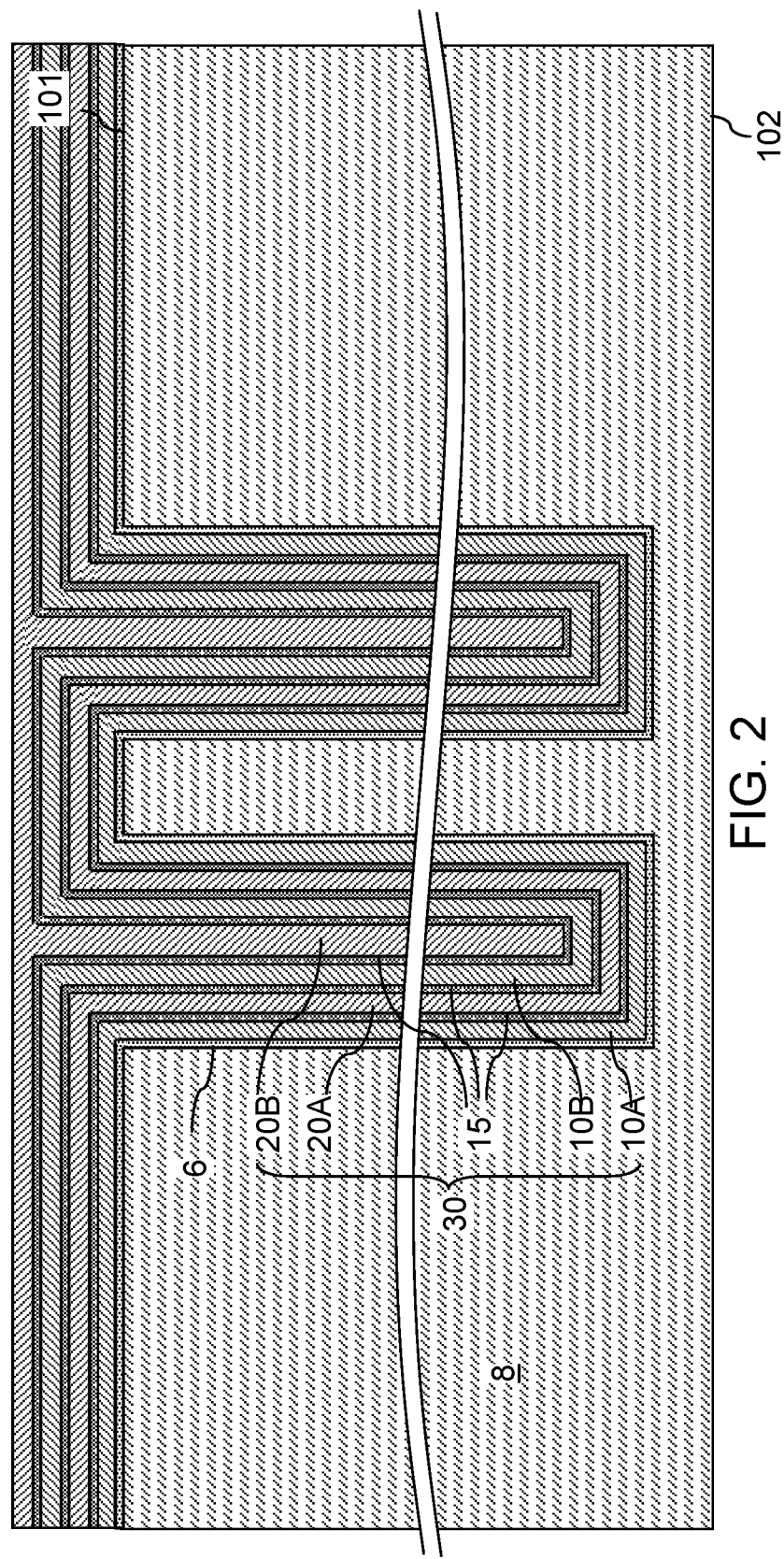
FIG. 2 is a vertical cross-sectional view of a region of the first exemplary structure after formation of an alternating layer stack including at least two first metallic electrode layers interlaced with at least one first node dielectric layer according to an embodiment of the present disclosure.

Referring to FIG. 2, a dielectric liner 6 may be formed on the physically exposed surface of the first substrate 8 including the top surface of the first substrate 8 and sidewalls of the first deep trenches 9. The dielectric liner 6 may include a dielectric material that provides electrical isolation between the first deep trench capacitors to be subsequently formed and the first substrate 8. For example, the dielectric liner 6 may include silicon oxide, silicon nitride, silicon oxynitride, and/or a dielectric metal oxide. Other suitable materials within the contemplated scope of disclosure may also be used. In an illustrative example, the dielectric liner 6 may include a silicon oxide layer formed by thermal oxidation of surface portions of the first substrate 8 that includes silicon. The thickness of the dielectric liner 6 may be in a range from 4 nm to 100 nm, although lesser and greater thicknesses may also be used.

A first alternating layer stack 30 of first metallic electrode layers (10A, 20A, 10B, 20B) and node dielectric layers 15 may be formed by a respective conformal deposition process. The first alternating layer stack 30 includes at least two first metallic electrode layers (10A, 20A, 10B, 20B) interlaced with at least one first node dielectric layer 15, and continuously extending over the top surface of the first substrate 8 and into each of the at least one first deep trench 9. The first alternating layer stack 30 continuously extends into each first deep trench 9, and a cavity is present in an unfilled volume each the first deep trench 9. Generally, the at least two first metallic electrode layers (10A, 20A, 10B, 20B) and the at least one first node dielectric layer 15 may be deposited by a respective conformal deposition process.

Each of the first metallic electrode layers (10A, 20A, 10B, 20B) may include a metallic material, which may comprise, and/or consist essentially of, a conductive metallic nitride, an elemental metal, or an intermetallic alloy. In one embodiment, each first metallic electrode layer (10A, 20A, 10B, 20B) comprises, and/or consists essentially of, a conductive metallic nitride material, which may be a metallic diffusion barrier material. For example, each first metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the first metallic electrode layers (10A, 20A, 10B, 20B) may be advantageous because diffusion of metallic elements through the node dielectric layers 15 and/or through the dielectric liner 6 may cause deleterious effects for deep trench capacitors. Each first metallic electrode layer (10A, 20A, 10B, 20B) may be formed by a conformal deposition process such as chemical vapor deposition (CVD) or atomic layer deposition (ALD). The thickness of each first metallic electrode layer (10A, 20A, 10B, 20B) may be in a range from 5 nm to 1,000 nm, such as from 20 nm to 300 nm, although lesser and greater thicknesses may also be used. In one embodiment, each first metallic electrode layer (10A, 20A, 10B, 20B) may have the same material composition and the same thickness. In another embodiment, each first metallic electrode layer (10A, 20A, 10B, 20B) may have the same material composition but have varying thicknesses. In yet another embodiment, each first metallic electrode layer (10A, 20A, 10B, 20B) may have different material composition and the same thickness. In yet another embodiment, each first metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layer 15 may include a dielectric metal oxide material such as aluminum oxide, aluminum silicon oxide, hafnium oxide, hafnium silicon oxide, zirconium oxide, zirconium silicon oxide, hafnium zirconium oxide, hafnium tantalum oxide, hafnium titanium oxide, titanium oxide, tantalum oxide, tantalum silicon oxide, lanthanum oxide, lanthanum silicon oxide, strontium titanium oxide (STO), barium titanium oxide (BTO), barium strontium titanium oxide (BSTO), barium zirconium oxide, hafnium lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 30 nm, such as from 3 nm to 15 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15. The ratio of a thickness of a first metallic electrode layer (10A, 20A, 10B, 20B) to a thickness of a first node dielectric layer 15 may be in a range from 3 to 100, such as from 6 to 50 and/or from 10 to 30, although lesser and greater ratios may also be employed.

The lower limit for the thickness of each first metallic electrode layer (10A, 20A, 10B, 20B) is determined by the resistance of the first metallic electrode layers (10A, 20A, 10B, 20B). For example, in embodiments in which the first metallic electrode layers (10A, 20A, 10B, 20B) include titanium nitride, the lower limit for the thickness of a node dielectric layer 15 may be about 3.8 nm. Different dielectric materials for the node dielectric layers 15 may provide a different lower limit for the thickness of node dielectric layers 15. The upper limit for the thickness of each node dielectric layer 15 is determined by reduction of the capacitance in the deep trench capacitor. Generally, the capacitance of the deep trench capacitor is inversely proportional to the thickness of the node dielectric layers 15. Thus, in the absence of excess leakage current, it is generally desirable to provide a lower thickness for the node dielectric layers 15. In case the node dielectric layers 15 include silicon nitride, it is desirable to limit the thickness of the node dielectric layers 15 to a thickness less than 12 nm, such as less than 9 nm and/or less than 6 nm.

The lower limit for the thickness of each node dielectric layer 15 is determined by the areal leakage current density. For example, in case a node dielectric layer 15 includes thermal silicon nitride, the lower limit for the thickness of a first metallic electrode layer (10A, 20A, 10B, 20B) may be about 24 nm. Different conductive materials for the first metallic electrode layers (10A, 20A, 10B, 20B) may provide a different lower limit for the thickness of first metallic electrode layers (10A, 20A, 10B, 20B). The upper limit for the thickness of each first metallic electrode layer (10A, 20A, 10B, 20B) is determined by the lateral dimensions in the deep trench capacitor. Generally, the greater the thickness of each first metallic electrode layer (10A, 20A, 10B, 20B), the greater the lateral dimensions of each deep trench capacitor, and thus, the lesser the total capacitance per unit area. Thus, in the absence of resistivity-limited performance issues in a deep trench capacitor, it is generally desirable to provide a lower thickness for the first metallic electrode layers (10A, 20A, 10B, 20B). In embodiments in which the first metallic electrode layers (10A, 20A, 10B, 20B) include titanium nitride, it is desirable to limit the thickness of the first metallic electrode layers (10A, 20A, 10B, 20B) to a thickness less than 400 nm, such as less than 200 nm and/or less than 100 nm and/or less than 50 nm.

In an illustrative example, the node dielectric layers 15 may have a thickness in a range from 4 nm to 8 nm, and the first metallic electrode layers (10A, 20A, 10B, 20B) can have a thickness in a range from 48 nm to 200 nm. In such embodiments, the ratio of a thickness of a first metallic electrode layer (10A, 20A, 10B, 20B) to a thickness of a first node dielectric layer 15 may be in a range from 6 to 50, although lesser and greater ratios may also be employed.

In one embodiment, the at least two first metallic electrode layers (10A, 10B, 20A, 20B) comprise at least three first metallic electrode layers (10A, 10B, 20A, 20B), and the at least one first node dielectric layer 15 comprises at least two first node dielectric layers 15. The total number of the first metallic electrode layers (10A, 20A, 10B, 20B) may be in a range from 3 to 16, such as from 4 to 8. The total number of the node dielectric layers 15 may be one less than the total number of the first metallic electrode layers (10A, 20A, 10B, 20B).

While the present disclosure is described using an embodiment in which the first alternating layer stack 30 of the first metallic electrode layers (10A, 20A, 10B, 20B) and the node dielectric layers 15 include four first metallic electrode layers (10A, 20A, 10B, 20B) and three node dielectric layers 15, embodiments are expressly contemplated herein in which different numbers of first metallic electrode layers (10A, 20A, 10B, 20B) and different numbers of node dielectric layers 15 may be used within the first alternating layer stack 30. Generally, a first alternating layer stack 30 may include at least two first metallic electrode layers (10A, 20A, 10B, 20B) interlaced with at least one first node dielectric layer 15 that may be formed in, and over, at least one first deep trench 9 formed in a first substrate 8.

The first metallic electrode layers (10A, 20A, 10B, 20B) may be sequentially numbered in the order of deposition. For example, the first metallic electrode layers (10A, 10B, 20A, 20B) may include a first primary metallic electrode layer 10A, a first secondary metallic electrode layer 20A, a second primary metallic electrode layer 10B, a secondary metallic electrode layer 20B, etc. Patterned portions of each primary metallic electrode layer (10A, 10B) may be subsequently used to form a primary electrode assembly that functions as a primary node, i.e., a first node, of a deep trench capacitor, and patterned portions of each secondary metallic electrode layer (20A, 20B) may be subsequently used to form a complementary electrode assembly that functions as a complementary node, i.e., a secondary node, of the deep trench capacitor. The total number of the first metallic electrode layers (10A, 20A, 10B, 20B), the thicknesses of the first metallic electrode layers (10A, 20A, 10B, 20B), and the width of the first deep trenches 9 may be selected such that a predominant portion (i.e., more than 50%), or all, of the entire volume of each first deep trench 9 may be filled with the first alternating layer stack 30 without completely filling the first deep trench 9. In embodiments in which any void is present in the first deep trenches 9, a dielectric fill material layer (not shown) may be deposited to fill or partially fill remaining voids in the first deep trenches 9.

Figure 3:
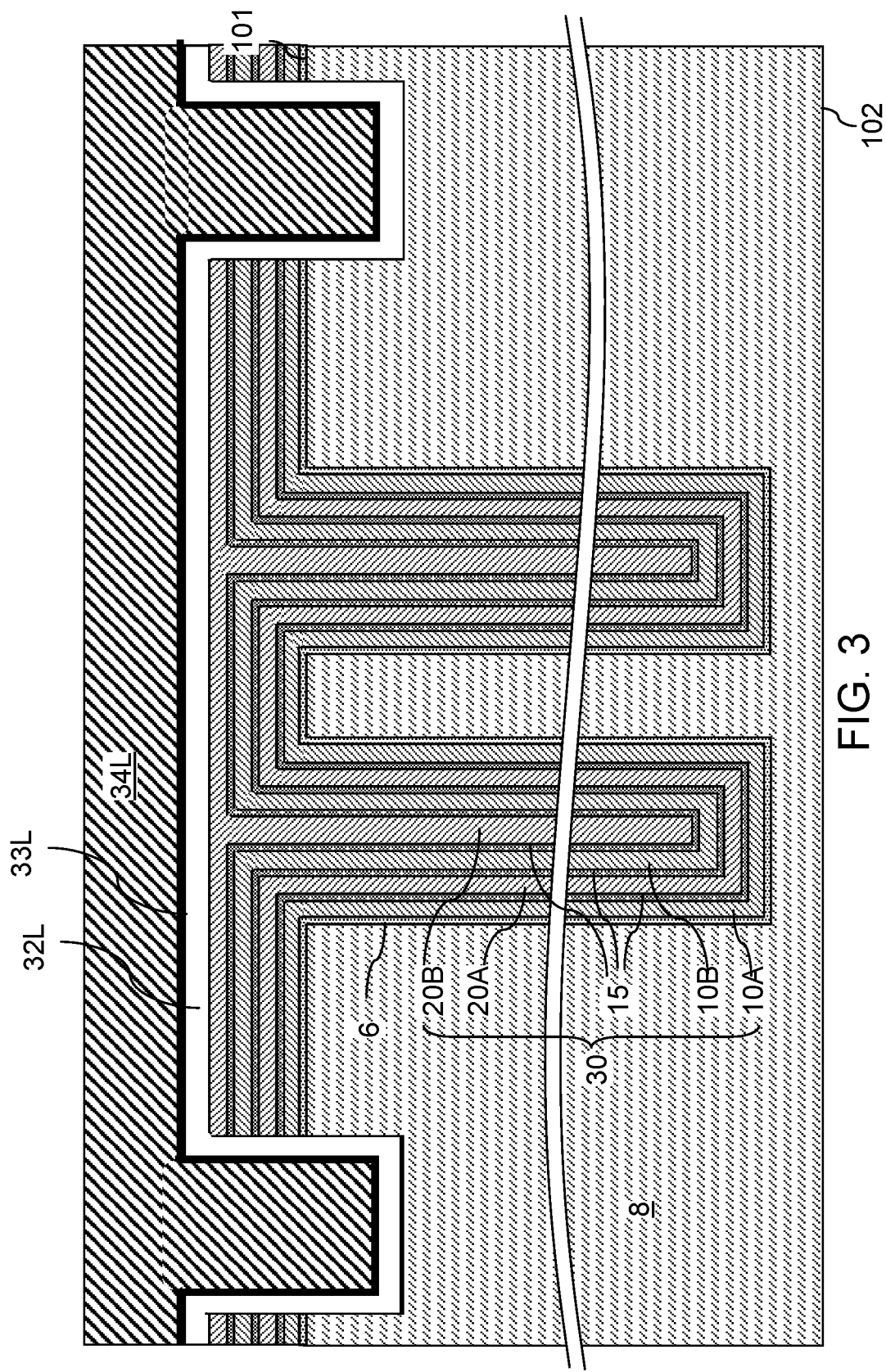
FIG. 3 is a vertical cross-sectional view of a region of the first exemplary structure after formation of pad cavities, a dielectric liner layer, and at least one metallic fill material layer according to an embodiment of the present disclosure.

Referring to FIG. 3, a photoresist layer (not shown) may be applied over the first exemplary structure, and may be lithographically patterned to form openings in areas that do not overlie the first deep trenches 9. Each opening may have a shape of a pad, and may have lateral dimensions in a range from 500 nm to 100 microns, such as from 1 micron to 30 microns, although lesser and greater lateral dimension may also be employed.

An anisotropic etch process may be performed to transfer the pattern of the openings in the photoresist layer through the horizontally-extending portions of the first alternating layer stack 30 and into an upper portion of the first substrate 8. Pad cavities extending into the upper portion of the first substrate 8 may be formed. The photoresist layer may be subsequently removed, for example, by ashing. The pad cavities may have rectangular, circular, or rounded rectangular horizontal cross-sectional shapes.

A dielectric liner layer 32L may be conformally deposited in the pad cavities and over the horizontally-extending portions of the first alternating layer stack 30. The dielectric liner layer 32L includes a dielectric material such as silicon oxide, and may have a thickness in a range from 20 nm to 600 nm, although lesser and greater thicknesses may also be employed.

At least one metallic fill material layer (33L, 34L) may be deposited over the dielectric liner layer 32L. The at least one metallic fill material layer (33L, 34L) may include a metallic nitride layer 33L and a metal layer 34L. The metallic nitride layer 33L may include a conductive metallic nitride material such as TiN, TaN, and/or WN, and may have a thickness in a range from 5 nm to 100 nm, although different materials and/or lesser or greater thicknesses may also be used for the metallic nitride layer. The metal layer 34L may include a low resistivity metallic material, which may be an elemental metal (such as Cu) or an intermetallic alloy material that may be bonded to another metallic material through metal-to-metal bonding.

Figure 4:
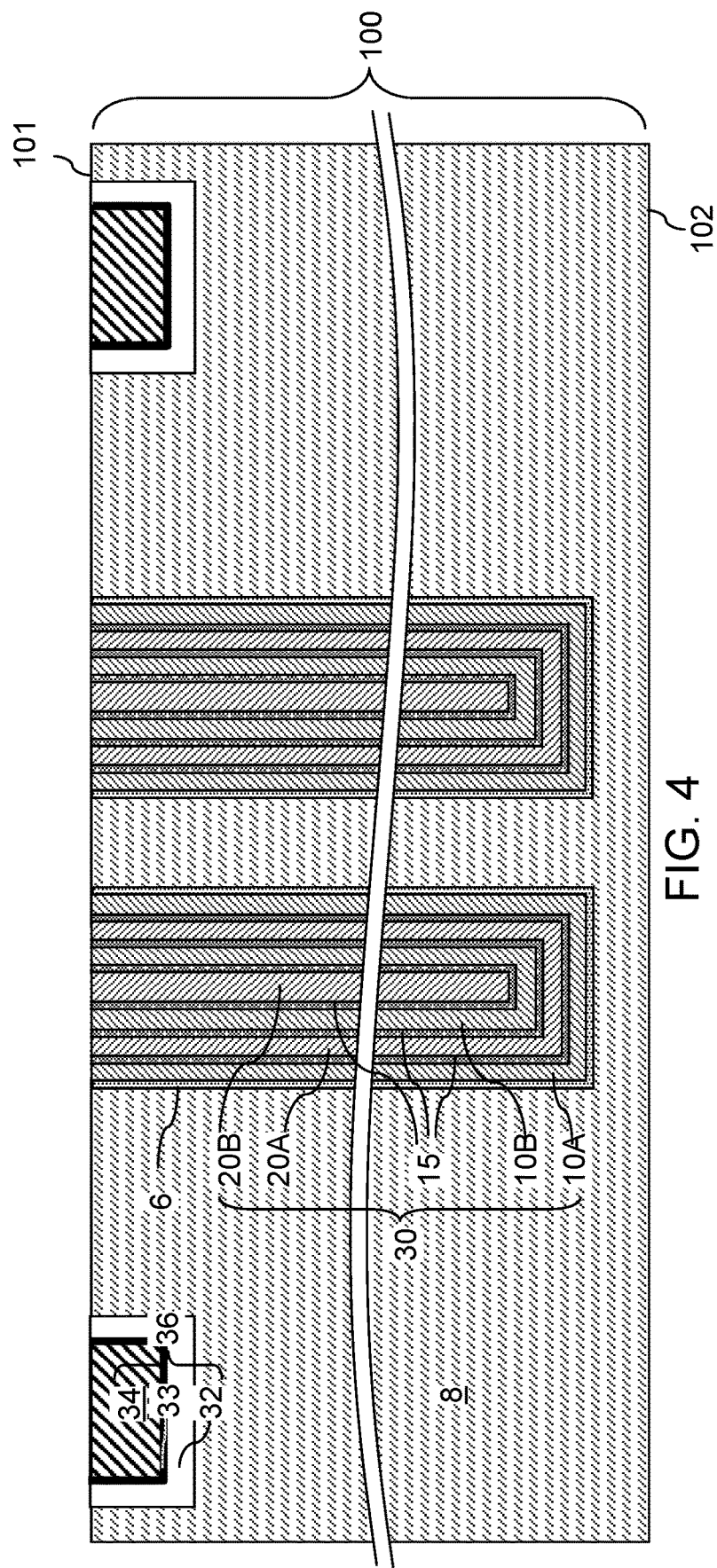
FIG. 4 is a vertical cross-sectional view of a region of the first exemplary structure after a planarization process that forms a first-tier capacitor assembly and first front-side metallic bonding pads according to an embodiment of the present disclosure.

Referring to FIG. 4, a planarization process may be performed to remove material portions from above the horizontal plane including the first front surface 101. Portions of the at least one metallic fill material layer (33L, 34L), the dielectric liner layer 32L, and the first alternating layer stack 30 are removed from above the first front surface 101 of the first substrate 8. Remaining portions of the at least one metallic fill material layer (33L, 34L), the dielectric liner layer 32L, and the first alternating layer stack 30 are embedded within the first substrate 8, and are located between the first front surface 101 and the first backside surface 102. The remaining portions of the first alternating layer stack 30 comprises at least one first deep trench capacitor. The remaining portions of the dielectric liner layer 32L comprise dielectric liners 32. The remaining portions of the metallic nitride layer 33L comprise metallic nitride liners 33. The remaining portions of the metal layer 34L comprise metal portions 34. The thickness of each metal portion 34 may be in a range from 200 nm to 5,000 nm, although lesser and greater thicknesses may also be employed. Each contiguous combination of a dielectric liner 32, a metallic nitride liner 33, and a metal portion 34 constitutes an electrically-isolated bonding pad assembly 36. Thus, each electrically-isolated bonding pad assembly 36 includes a respective first metallic bonding pad (33, 34) and a respective dielectric liner 32. Each contiguous combination of a metallic nitride liner 33 and a metal portion 34 constitutes a metal bonding pad (33, 34). The length-to-width ratio of each metal bonding pad (33, 34) may be in a range from ¼ to 4, such as from ½ to 2 and/or from 0.9 to 1.1 (e.g., 1.0), although lesser and greater ratios may also be employed. The length-to-height ratio of each metal bonding pad (33, 34) may be in a range from ½ to 30, such as from 1 to 10 and/or from 2 to 4, although lesser and greater ratios may also be employed.

Generally, the length and the width of each metal bonding pad (33, 34) is limited by the density of the electrically isolated deep trenches. Two metal bonding pads (33, 34) may be employed to provide an electrical connection to each deep trench capacitor. In an illustrative example, the metal bonding pads (33, 34) may be provided with a horizontal cross-sectional shape of a square or a rounded square (i.e., a shape modified from a square by rounding the four corners), and the wall-to-wall distance of each facing pair of sidewalls (which is the same as the length of a sidewall in case of a square horizontal cross-sectional shape) may be in a range from 1 micron to 20 microns. In one embodiment, each metal bonding pad (33, 34) may have a thickness in a range from 1 micron to 2 microns. Thus, the length-to-height ratio of each metal bonding pad (33, 34) may be in a range from 1 to 10, although lesser and greater ratios may also be employed.

Generally, each first deep trench capacitor includes at least two first metallic electrode layers (10A, 10B, 20A, 20B) interlaced with at least one first node dielectric layer 15. The first metallic bonding pads (33, 34) may be located on, and underneath, the first front surface 101. The combination of material portions located between the first front surface 101 and the first backside surface 102 constitutes a first-tier capacitor assembly 100. In one embodiment, each layer within the first alternating layer stack 30 laterally surrounds, or is laterally surrounded by, any other layer within the first alternating layer stack 30.

Figure 5:
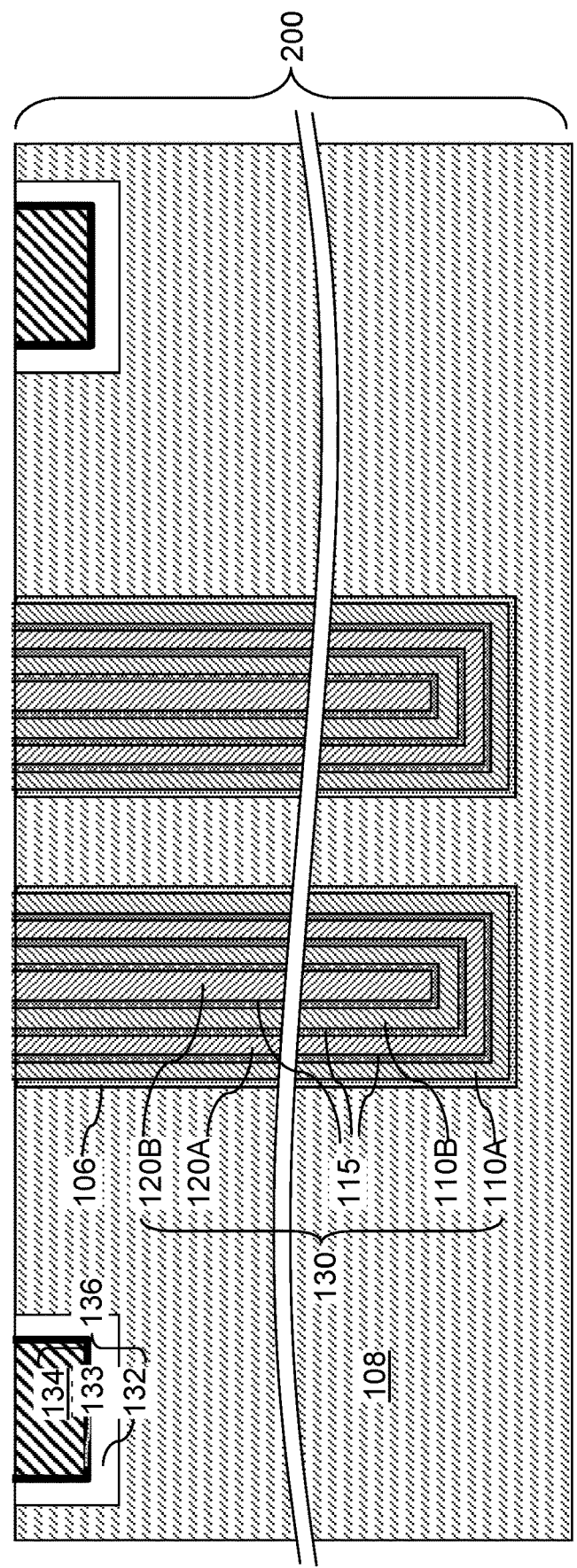
FIG. 5 is a vertical cross-sectional view of a region of a second-tier capacitor assembly and second backside metallic bonding pads according to an embodiment of the present disclosure.

Referring to FIG. 5, a second-tier capacitor assembly 200 may be provided by performing a same set of processing steps as the set of processing steps for forming the first-tier capacitor assembly 100. In one embodiment, the second-tier capacitor assembly 200 may be a replica of the first-tier capacitor assembly. The second-tier capacitor assembly 200 includes at least one second deep trench capacitor and metallic bonding pads, which are subsequently bonded to the first metallic bonding pads and are herein referred to as second metallic bonding pads (133, 134). Each second metallic bonding pad (133, 134) may include a metallic nitride liner 133 and a metal portion 134.

Generally, each second deep trench capacitor includes a dielectric liner 106 which may include a dielectric material that provides electrical isolation between the first deep trench capacitors to be subsequently formed and the second substrate 108. For example, the dielectric liner 106 may include silicon oxide, silicon nitride, silicon oxynitride, and/or a dielectric metal oxide. Other suitable materials within the contemplated scope of disclosure may also be used. In an illustrative example, the dielectric liner 106 may include a silicon oxide layer formed by thermal oxidation of surface portions of the second substrate 108 that includes silicon. The thickness of the dielectric liner 106 may be in a range from 4 nm to 100 nm, although lesser and greater thicknesses may also be used.

The second deep trench capacitor includes a second alternating layer stack 130 of a dielectric liner 106 and at least two second metallic electrode layers (110A, 110B, 120A, 120B) interlaced with at least one second node dielectric layer 115. For example, the second metallic electrode layers (110A, 110B, 120A, 120B) may include a first primary metallic electrode layer 110A, a first secondary metallic electrode layer 120A, a second primary metallic electrode layer 110B, a second secondary metallic electrode layer 120B, etc. The second metallic bonding pads (133, 134) may be located on, and underneath, a top surface of a second substrate 108, Each electrically-isolated bonding pad assembly 136 may include a respective second metallic bonding pad (133, 134) and a respective dielectric liner 132.

Figure 6:
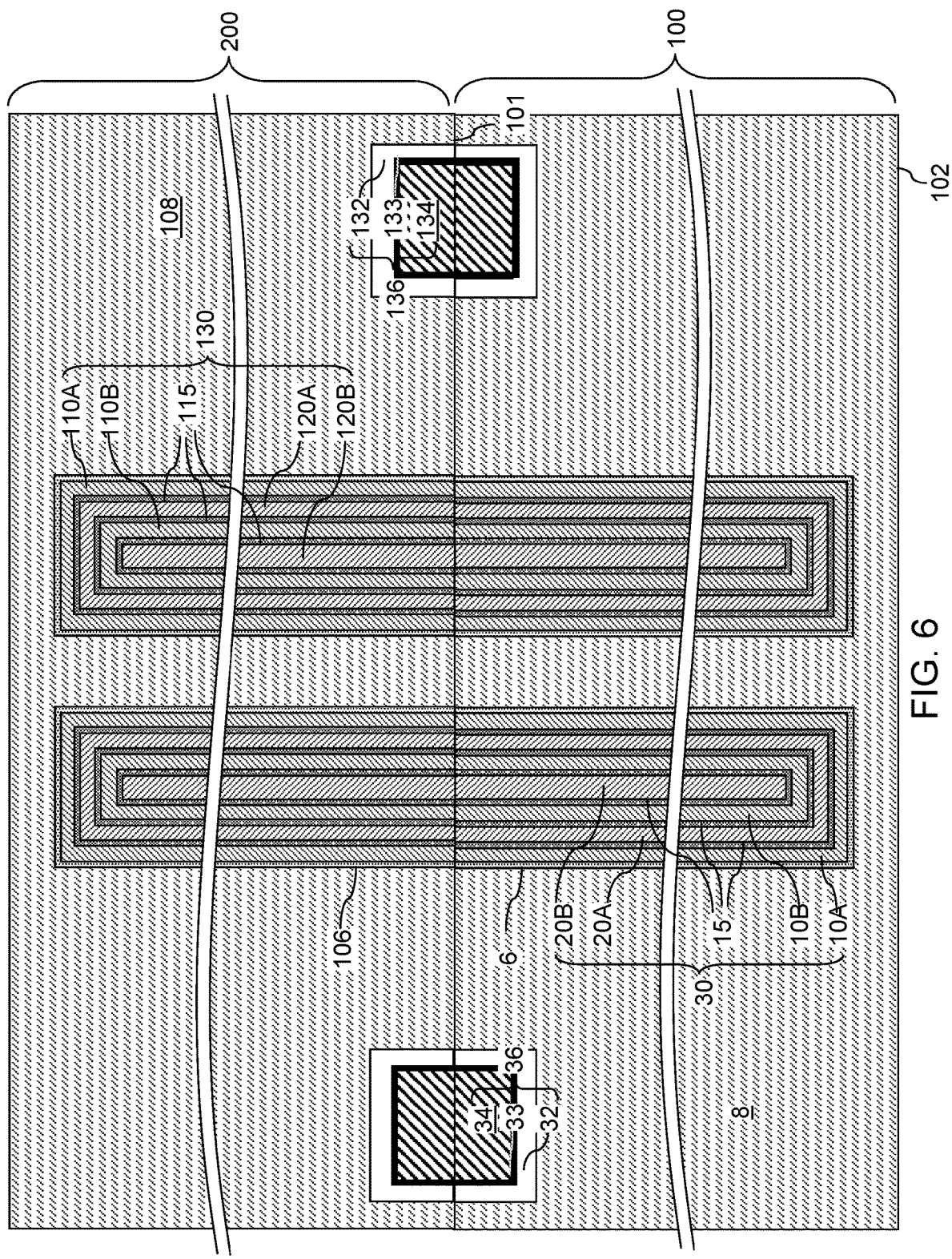
FIG. 6 is a vertical cross-sectional view of a region of the first exemplary structure after bonding the second substrate to the first substrate according to an embodiment of the present disclosure.

Referring to FIG. 6, the second-tier capacitor assembly 200 may be subsequently bonded to the first-tier capacitor assembly 100 in an upside-down position. Thus, the horizontal top surface of the second-tier capacitor assembly 200 is herein referred to as a second backside surface, and the horizontal bottom surface of the second-tier capacitor assembly 200 is herein referred to as a second front surface. The second front surface and the second backside surface that are parallel to each other. Generally, at least one second alternating layer stack 130 including at least two second metallic electrode layers (110A, 110B, 120A, 120B) interlaced with at least one second node dielectric layers 115 may be formed within the second substrate 108. The second metallic bonding pads (133, 134) are located on, and underneath, the second backside surface. The pattern of the second metallic bonding pads (133, 134) may be a mirror image pattern of the pattern of the first metallic bonding pads (33, 34). The pattern of the second deep trench capacitors may be a mirror image pattern of the pattern of the first deep trench capacitors. Each second metallic electrode layer (110A, 110B, 120A, 120B) contacts a respective one of the first metallic electrode layers (10A, 10B, 20A, 20B).

Figure 7:
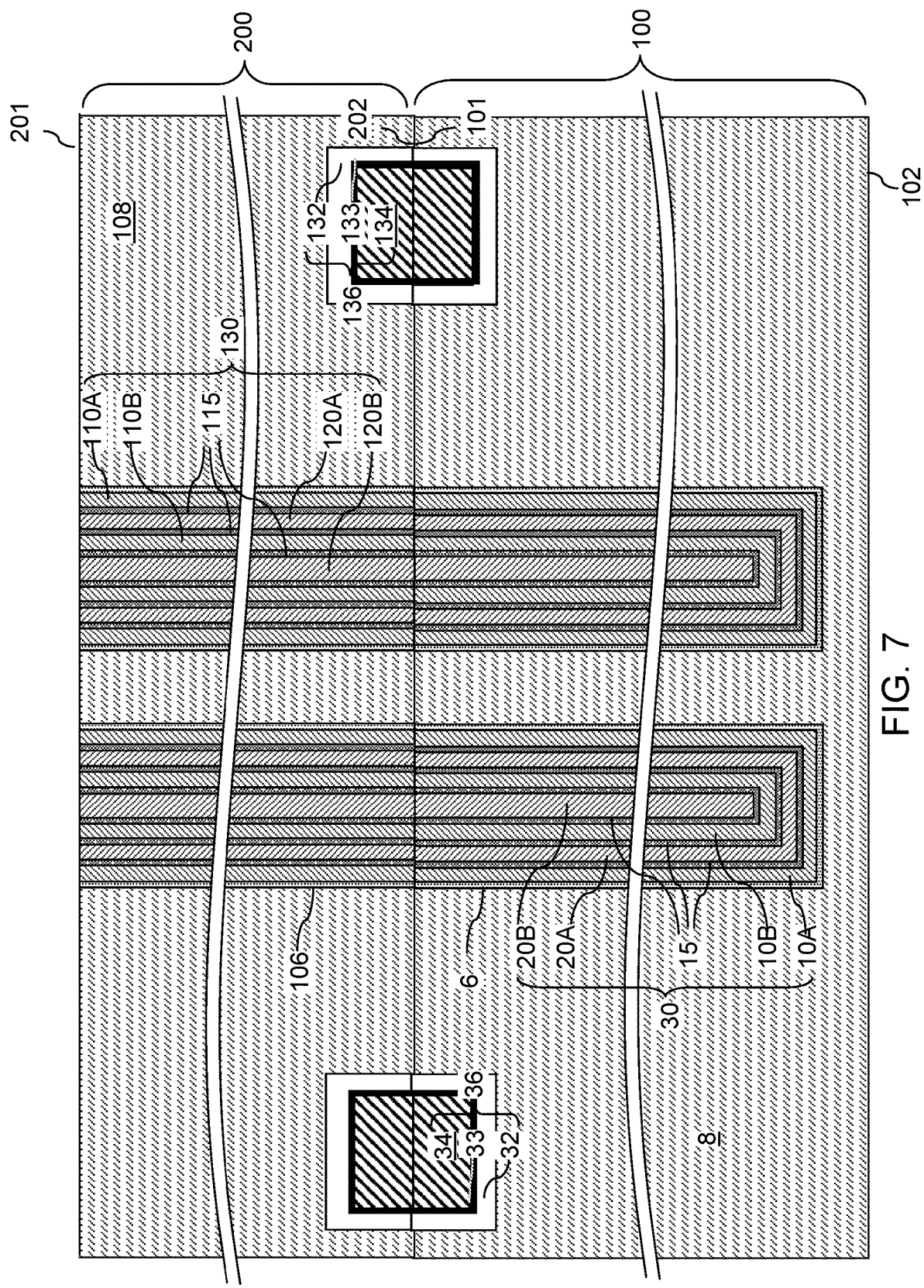
FIG. 7 is a vertical cross-sectional view of a region of the first exemplary structure after thinning the second substrate according to an embodiment of the present disclosure.

Referring to FIG. 7, the backside (i.e., the top side as illustrated in FIG. 7) of the second-tier capacitor assembly 200 may be removed, for example, by grinding, polishing, an anisotropic etch process, an isotropic etch process, or a combination thereof. For example a grinding process may be employed to remove a predominant portion of the second substrate 108 that overlies topmost surfaces of the second alternating layer stack 130, and a chemical mechanical planarization (CMP) process may be performed to remove additional portions of the second substrate 108 and the second alternating layer stack 130 concurrently. Each layer within the second alternating layer stack 130 may be physically exposed after the CMP process. Generally, the second substrate 108 may be thinned such that each layer within the second alternating layer stack 130 is physically exposed on a thinned side of the second substrate 108, which may be a top side of the second substrate 108 as illustrated in FIG. 7, or may be positioned upside down. In one embodiment, the polished surface of the second substrate 108 may include a second front surface 201. The surface of the second substrate 108 that contacts the first front surface 101 of the first substrate 8 comprises a second backside surface 202. Generally, a planarized surface of the second substrate 108 that is provided by thinning the second substrate 108 may comprise one of the second front surface 201 and the second backside surface 202.

The first exemplary structure comprises a first-tier capacitor assembly 100 and a second-tier capacitor assembly 200. The first-tier capacitor assembly 100 comprises a first substrate 8 having a first front surface 101 and a first backside surface 102 that are parallel to each other, a first alternating layer stack 30 embedded within the first substrate 8 and including at least two first metallic electrode layers (10A, 10B, 20A, 20B) interlaced with at least one first node dielectric layer 15, and first metallic bonding pads (33, 34) located on the first front surface 101. The second-tier capacitor assembly 200 comprises a second substrate 108 having a second front surface 201 and a second backside surface 202 that are parallel to each other, a second alternating layer stack 130 embedded within the second substrate 108 and including at least two second metallic electrode layers (110A, 110B, 120A, 120B) interlaced with at least one second node dielectric layers 115, and second metallic bonding pads (133, 134) located on the second backside surface 202 and bonded to the first metallic bonding pads (33, 34).

Each of the at least two first metallic electrode layers (10A, 10B, 20A, 20B) and at least one first node dielectric layer 15 comprises a respective vertically extending portion that extends from the first front surface 101 toward the first backside surface 102. Each of the at least two second metallic electrode layers (110A, 110B, 120A, 120B) and at least one second node dielectric layer 115 comprises a respective vertically extending portion that extends from the second front surface 201 to the second backside surface 202.

Figure 8A:
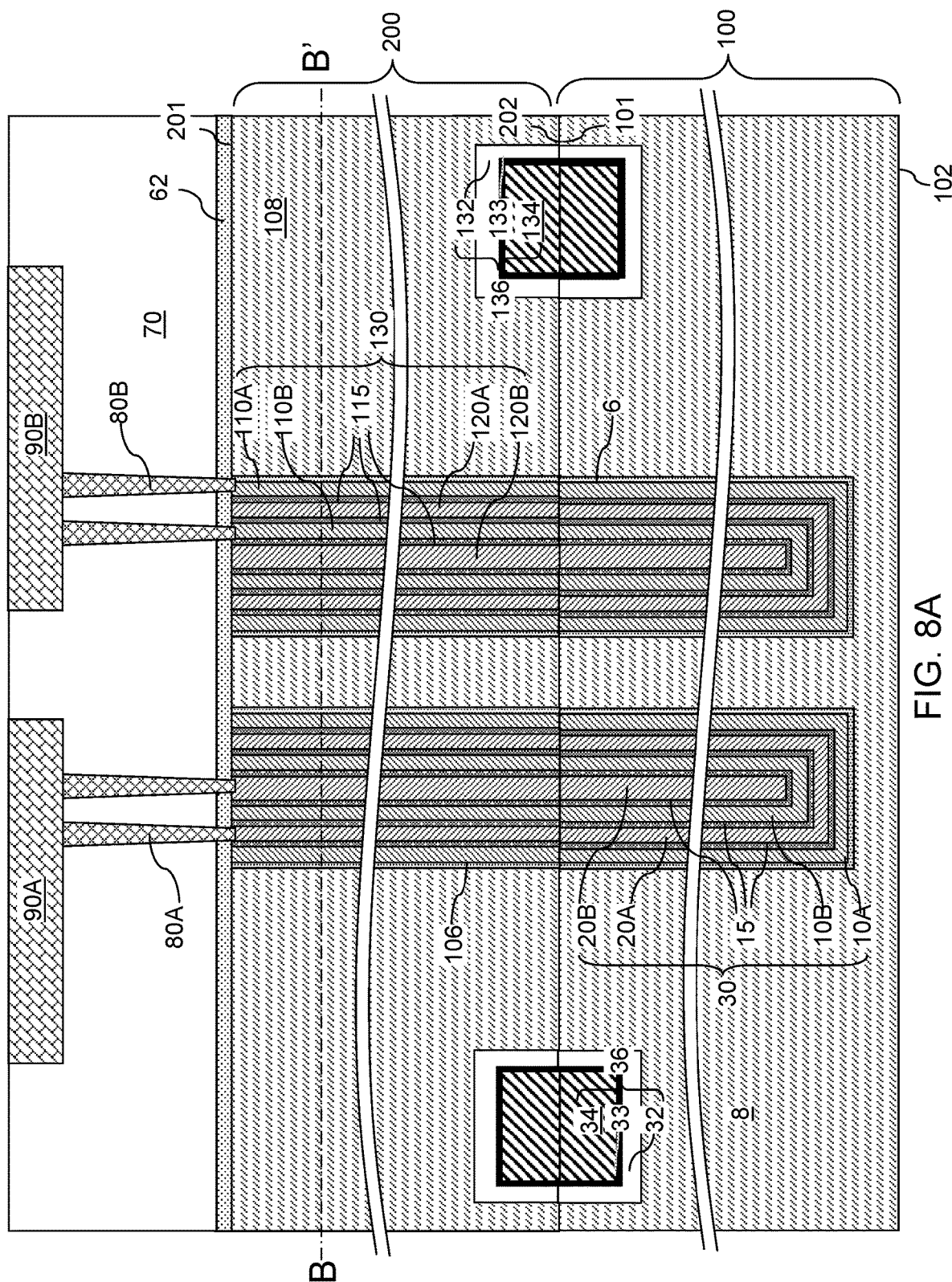
FIG. 8A is a vertical cross-sectional view of a region of the first exemplary structure after formation of an interconnect-level dielectric layer and contact via structures according to an embodiment of the present disclosure.
Figure 8B:
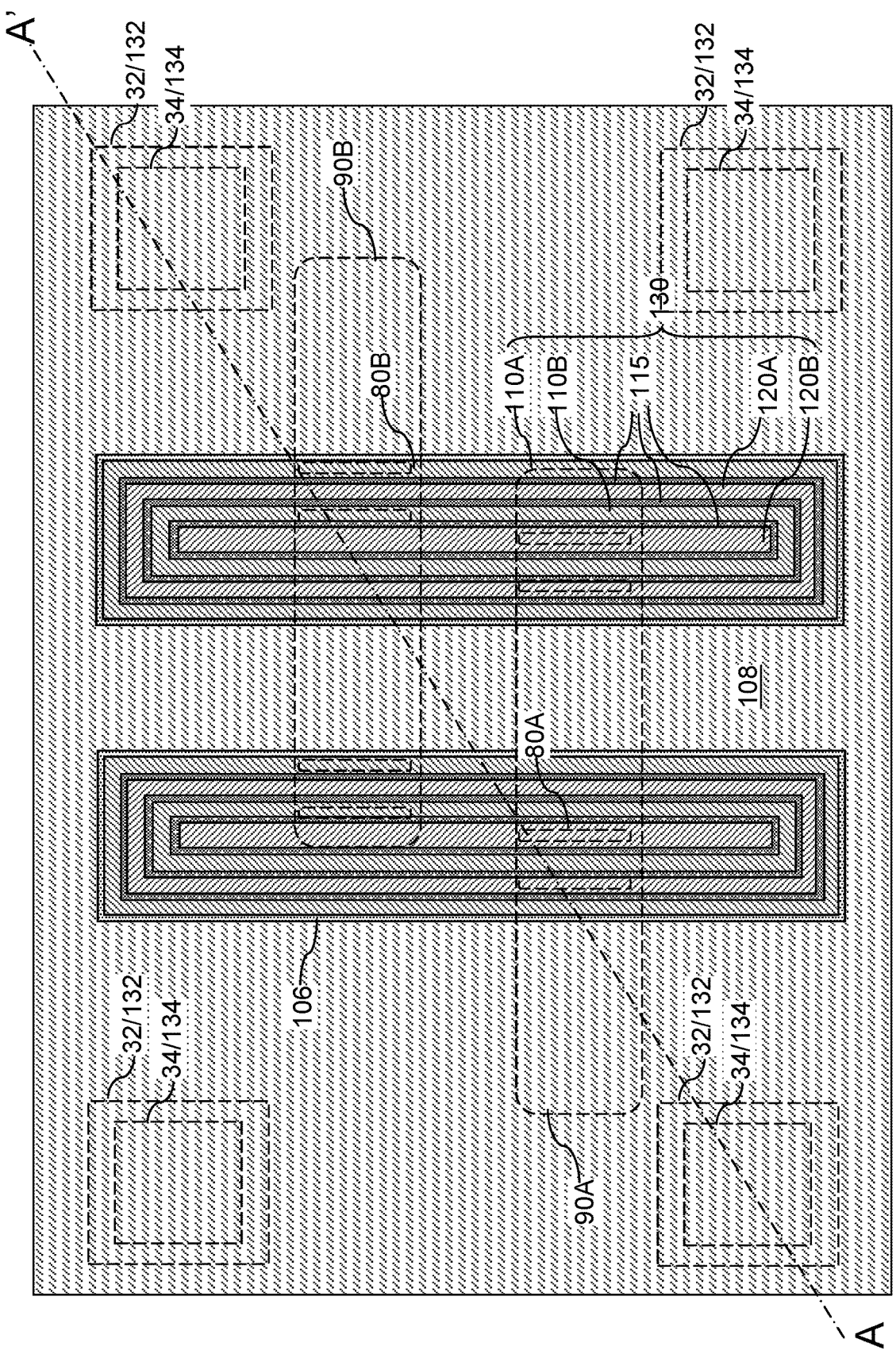
FIG. 8B is a horizontal cross-sectional view of a region of the first exemplary structure along the horizontal plane B-B' of FIG. 8A.

FIG. 8A is a vertical cross-sectional view of a region of the first exemplary structure after formation of an interconnect-level dielectric layer and contact via structures according to an embodiment of the present disclosure. FIG. 8B is a horizontal cross-sectional view of a region of the first exemplary structure along the horizontal plane B-B' of FIG. 8A. Locations of structures that are not located within the horizontal plane B-B' are illustrated in dotted lines.

Referring to FIGS. 8A and 8B, an etch stop dielectric layer 62 may be deposited on the second front surface 201, and at least one interconnect-level dielectric layer 70 may be deposited over the etch stop dielectric layer 62. Metal interconnect structures (80A, 80B, 90A, 90B) may be formed in the at least one interconnect-level dielectric layer 70. The metal interconnect structures (80A, 80B, 90A, 90B) may include first contact via structures 80A contacting a first subset of the second metallic electrode layers (110A, 110B, 120A, 120B) and second contact via structures 80B contacting a second subset of the second metallic electrode layers (110A, 110B, 120A, 120B). Each of the contact via structures (80A, 80B) may be electrically connected to a set of a respective one of the at least two first metallic electrode layers (10A, 10B, 20A, 20B) and a respective one of the at least two second metallic electrode layers (110A, 110B, 120A, 120B). The metal interconnect structures (80A, 80B, 90A, 90B) may include metallic bonding pads (90A, 90B), which may include a first metallic bonding pad 90A that may be electrically connected to the first contact via structures 80A, and a second metallic bonding pad 90B that may be electrically connected to the second contact via structures 80B.

Figure 9:
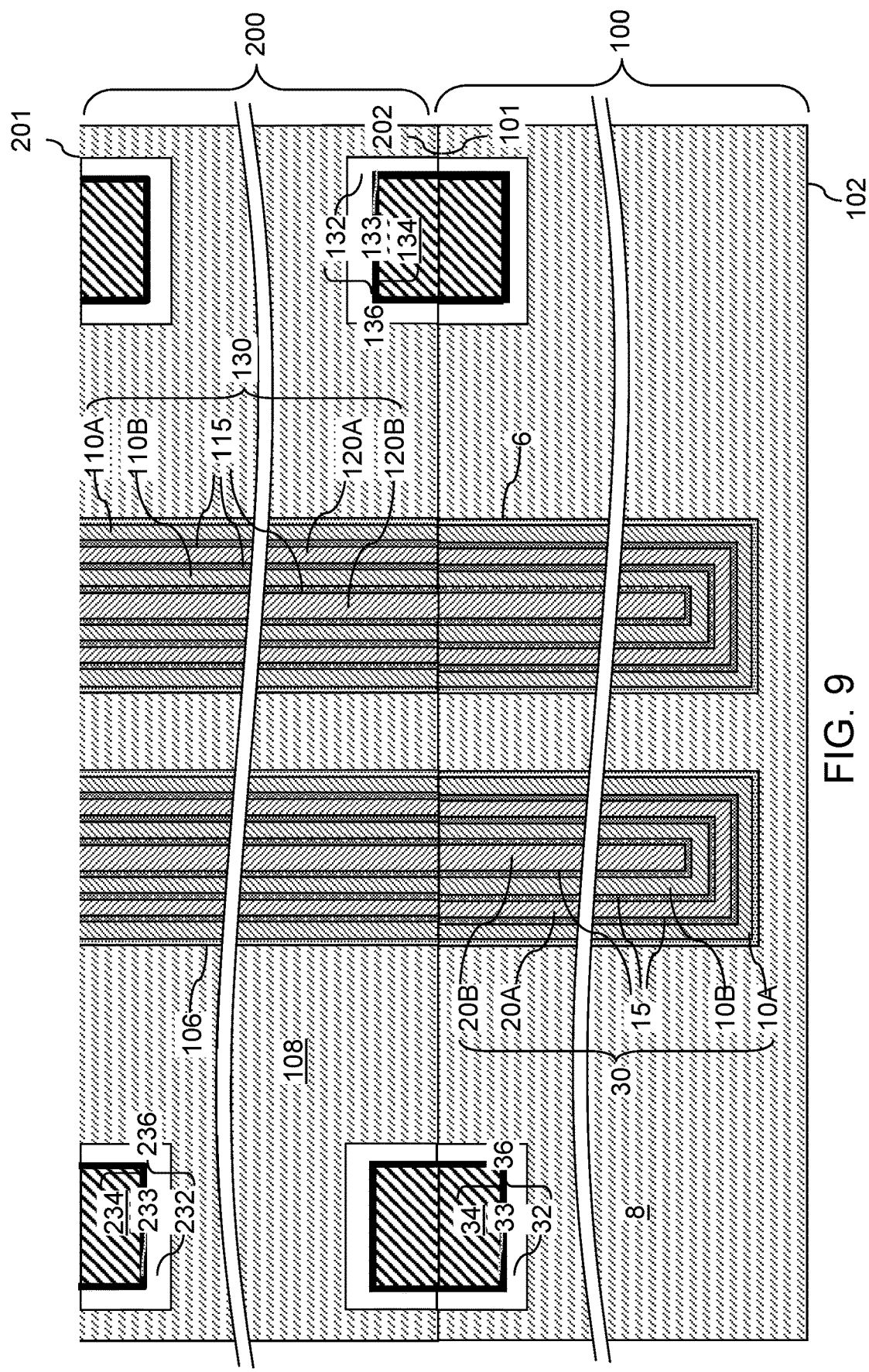
FIG. 9 is a vertical cross-sectional view of a region of an alternative configuration of the first exemplary structure after formation of second front-side metallic bonding pads according to an alternative embodiment of the present disclosure.

Referring to FIG. 9, an alternative configuration of the first exemplary structure may be derived from the first exemplary structure of FIG. 7 by forming additional metallic bonding pads on the front side of the second-tier capacitor assembly 200. For example, a photoresist layer may be applied over the second front surface 201 of the second-tier capacitor assembly 200, and may be lithographically patterned to form openings in areas outside the areas of the second alternating layer stacks 130. A dielectric liner layer and at least one metallic material layer may be deposited in the pad cavities, and may be subsequently planarized to form electrically-isolated bonding pad assemblies 236 on, and underneath, the second front surface 201 of the second-tier capacitor assembly 200. Each electrically-isolated bonding pad assembly may include a respective third metallic bonding pad (233, 234) and a respective dielectric liner 232. Each third metallic bonding pad (233, 234) may include a metallic nitride liner 233 and a metal portion 234.

Figure 10:
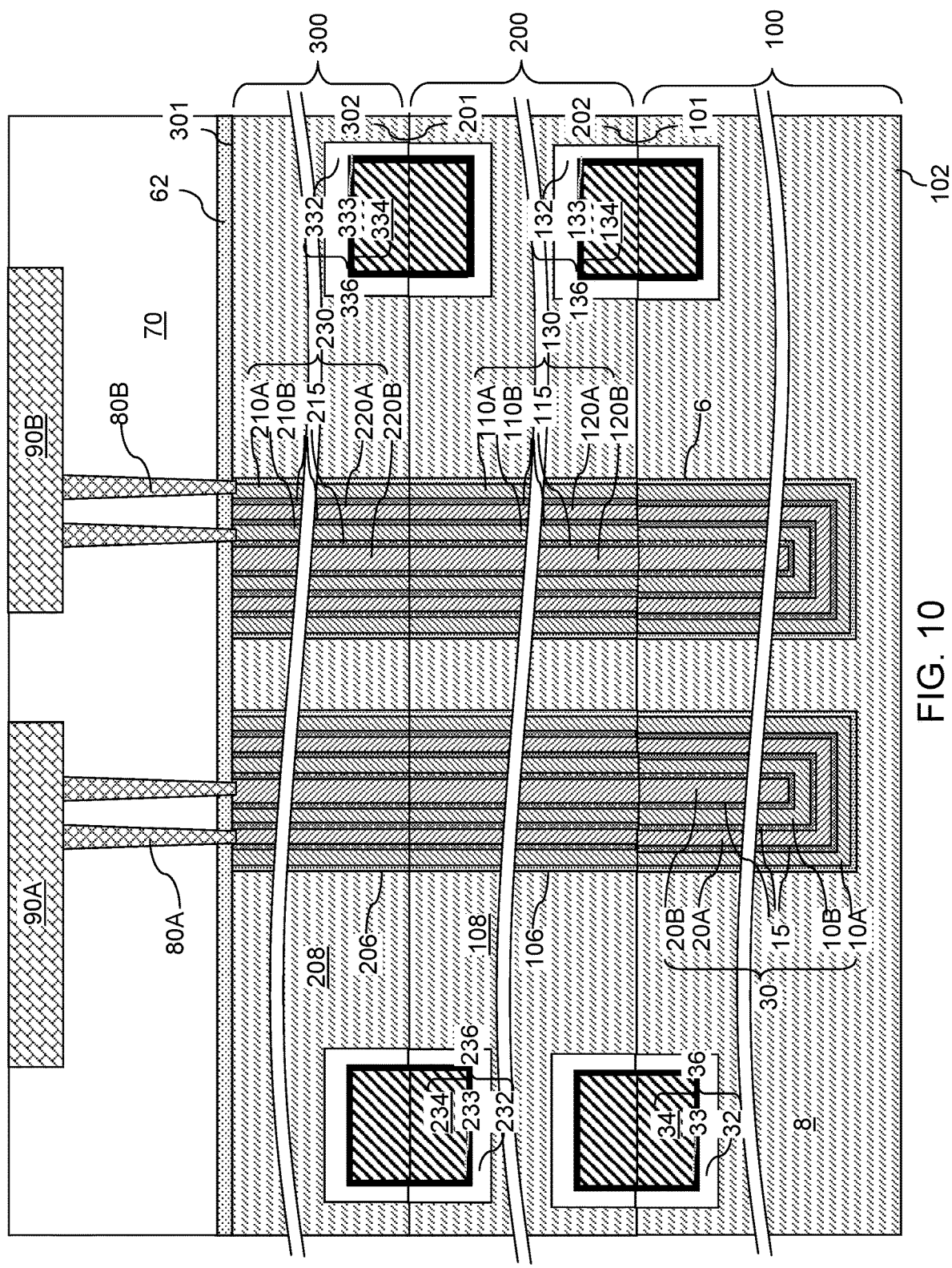
FIG. 10 is a vertical cross-sectional view of a region of the alternative configuration of the first exemplary structure after formation of an interconnect-level dielectric layer and contact via structures according to an alternative embodiment of the present disclosure.

Referring to FIG. 10, a third-tier capacitor assembly 300 may be provided by performing a same set of processing steps as the set of processing steps for forming the second-tier capacitor assembly 200 as illustrated in FIGS. 8A and 8B with the modification that the third-tier capacitor assembly 300 is attached to the second-tier capacitor assembly 200 of FIG. 9. In one embodiment, the third-tier capacitor assembly 300 may be a replica of the second-tier capacitor assembly 200. The third-tier capacitor assembly 300 includes at least one third deep trench capacitor and metallic bonding pads, which may be bonded to the third metallic bonding pads (233, 234) and are herein referred to as fourth metallic bonding pads (333, 334). Each fourth metallic bonding pad (333, 334) may include a metallic nitride liner 333 and a metal portion 334.

Generally, each third deep trench capacitor includes a dielectric liner 206 which may include a dielectric material that provides electrical isolation between the first deep trench capacitors to be subsequently formed and the third substrate 208. For example, the dielectric liner 206 may include silicon oxide, silicon nitride, silicon oxynitride, and/or a dielectric metal oxide. Other suitable materials within the contemplated scope of disclosure may also be used. In an illustrative example, the dielectric liner 206 may include a silicon oxide layer formed by thermal oxidation of surface portions of the third substrate 208 that includes silicon. The thickness of the dielectric liner 206 may be in a range from 4 nm to 100 nm, although lesser and greater thicknesses may also be used.

The third deep trench capacitor includes a third alternating layer stack 230 of at least two third metallic electrode layers (210A, 210B, 220A, 220B) interlaced with at least one third node dielectric layer 215. For example, the third metallic electrode layers (210A, 210B, 220A, 220B) may include a first primary metallic electrode layer 210A, a first secondary metallic electrode layer 220A, a second primary metallic electrode layer 210B, a second secondary metallic electrode layer 220B, etc. The fourth metallic bonding pads (333, 334) may be located on, and above, a bottom surface of the third substrate 208, Each electrically-isolated bonding pad assembly 336 may include a respective fourth metallic bonding pad (333, 334) and a respective dielectric liner 332.

The third-tier capacitor assembly 300 may be subsequently bonded to the second-tier capacitor assembly 200. The horizontal top surface of the third-tier capacitor assembly 300 as bonded to the second-tier capacitor assembly 200 is herein referred as a third front surface 301, and the horizontal bottom surface of the third-tier capacitor assembly 300 as bonded to the second-tier capacitor assembly 200 is herein referred to as a third backside surface 302. The third front surface 301 and the third backside surface 302 may be parallel to each other. Generally, at least one third alternating layer stack 230 including at least two third metallic electrode layers (210A, 210B, 220A, 220B) interlaced with at least one third node dielectric layers 215 may be formed within the third substrate 208.

Subsequently, the processing steps of FIGS. 8A and 8B may be performed mutatis mutandis to form an etch stop dielectric layer 62, at least one interconnect-level dielectric layer 70, and metal interconnect structures (80A, 80B, 90A, 90B). The metal interconnect structures (80A, 80B, 90A, 90B) may include first contact via structures 80A contacting a first subset of the third metallic electrode layers (210A, 210B, 220A, 220B) and second contact via structures 80B contacting a second subset of the third metallic electrode layers (210A, 210B, 220A, 220B). Each of the contact via structures (80A, 80B) is electrically connected to a set of a respective one of the at least two first metallic electrode layers (10A, 10B, 20A, 20B), a respective one of the at least two second metallic electrode layers (110A, 110B, 120A, 120B), and a respective one of the at least two third metallic electrode layers (210A, 210B, 220A, 220B). The metal interconnect structures (80A, 80B, 90A, 90B) may include metallic bonding pads (90A, 90B), which may include a first metallic bonding pad 90A that is electrically connected to the first contact via structures 80A, and a second metallic bonding pad 90B that is electrically connected to the second contact via structures 80B.

Figure 11A:
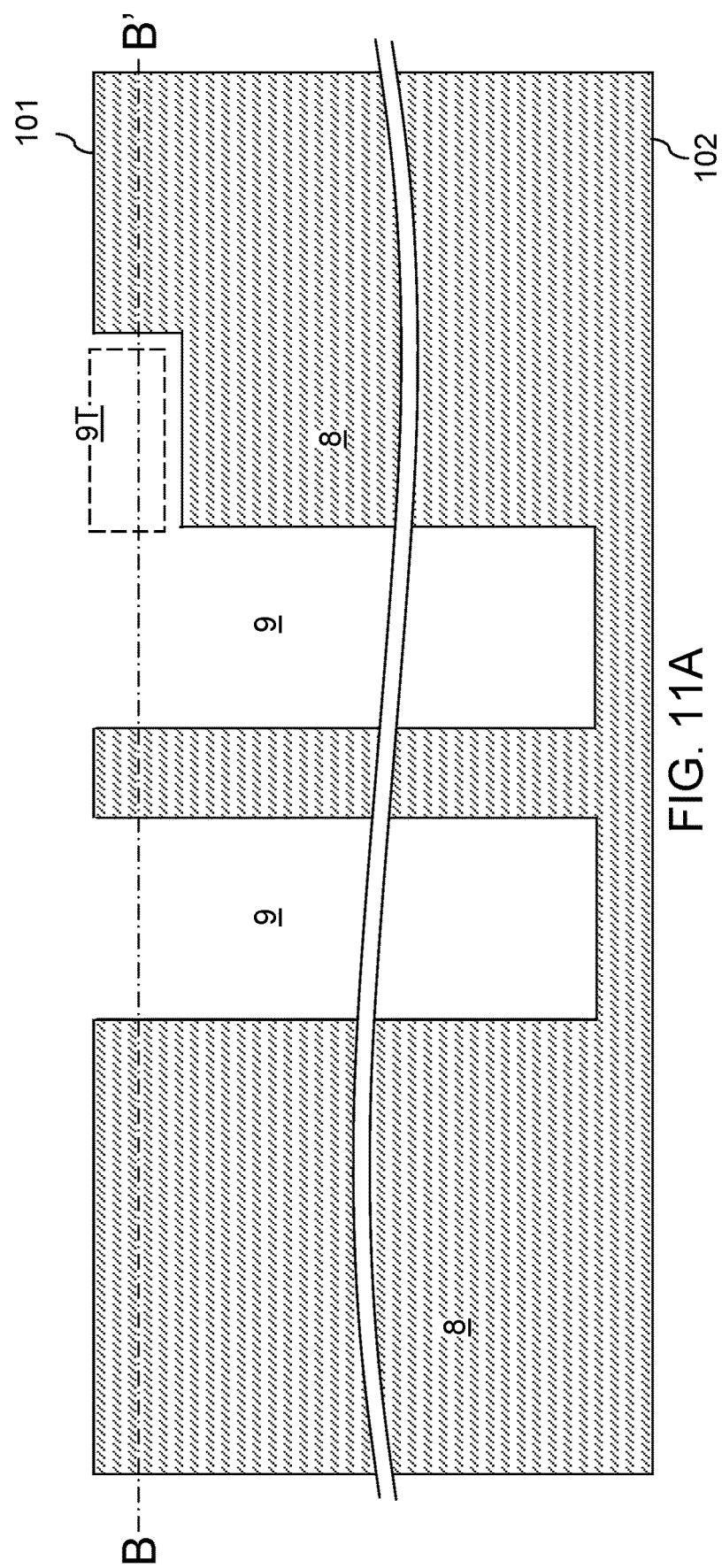
FIG. 11A is a vertical cross-sectional view of a region of a second exemplary structure after formation of deep trenches and at least one tab recess region according to an embodiment of the present disclosure.
Figure 11B:
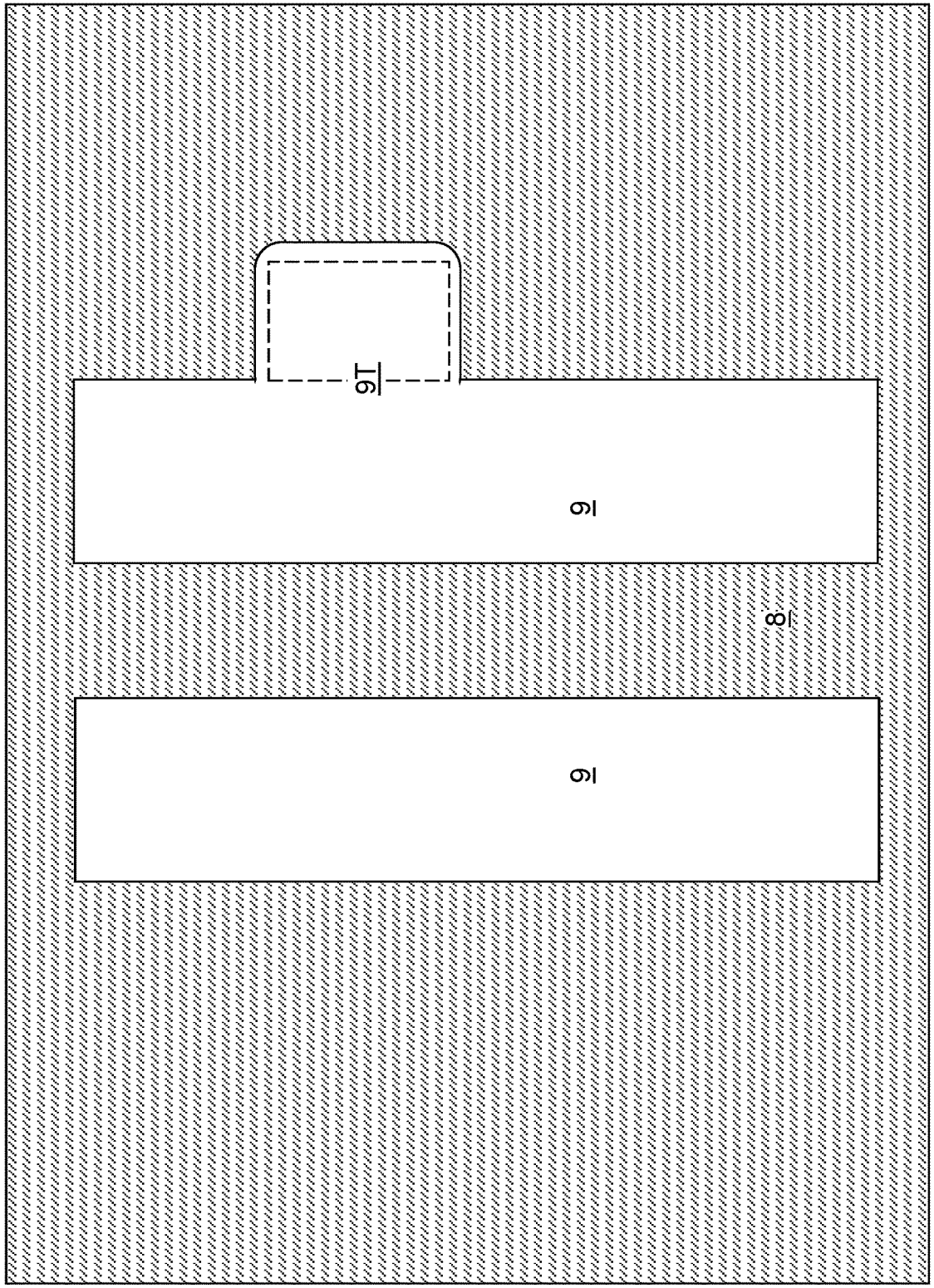
FIG. 11B is a horizontal cross-sectional view of a region of the second exemplary structure along the horizontal plane B-B' of FIG. 11A.

FIG. 11A is a vertical cross-sectional view of a region of a second exemplary structure after formation of deep trenches and at least one tab recess region according to an embodiment of the present disclosure. FIG. 11B is a horizontal cross-sectional view of a region of the second exemplary structure along the horizontal plane B-B' of FIG. 11A. Referring to FIGS. 11A and 11B, a second exemplary structure according to an embodiment of the present disclosure may be derived from the first exemplary structure of FIG. 1 by forming at least one tab recess region 9T. Each tab recess region 9T is adjoined to an upper end of a first deep trench 9, and has a thickness that is less than the total thickness of the first alternating layer stack (10A, 10B, 20A, 20B) to be subsequently formed. In one embodiment, the depth of each tab recess region 9T may be selected such that a horizontally-extending portion of a first node dielectric layer 15 may be formed within the horizontal plane including the first front surface 101. Generally, each tab recess region 9T has a depth that is less than the sum of thicknesses of all layers within a first alternating layer stack to be subsequently formed, and is adjoined to an upper portion of a respective one of the at least one first deep trench 9. For example, the depth of each tab recess region 9T may be in a range from 10 nm to 400 nm, such as from 20 nm to 200 nm, although lesser and greater depths may also be employed. The lateral extent of each tab recess region 9T may be on the order of the total thickness of the first alternating layer stack (10A, 10B, 20A, 20B) to be subsequently formed.

Figure 12:
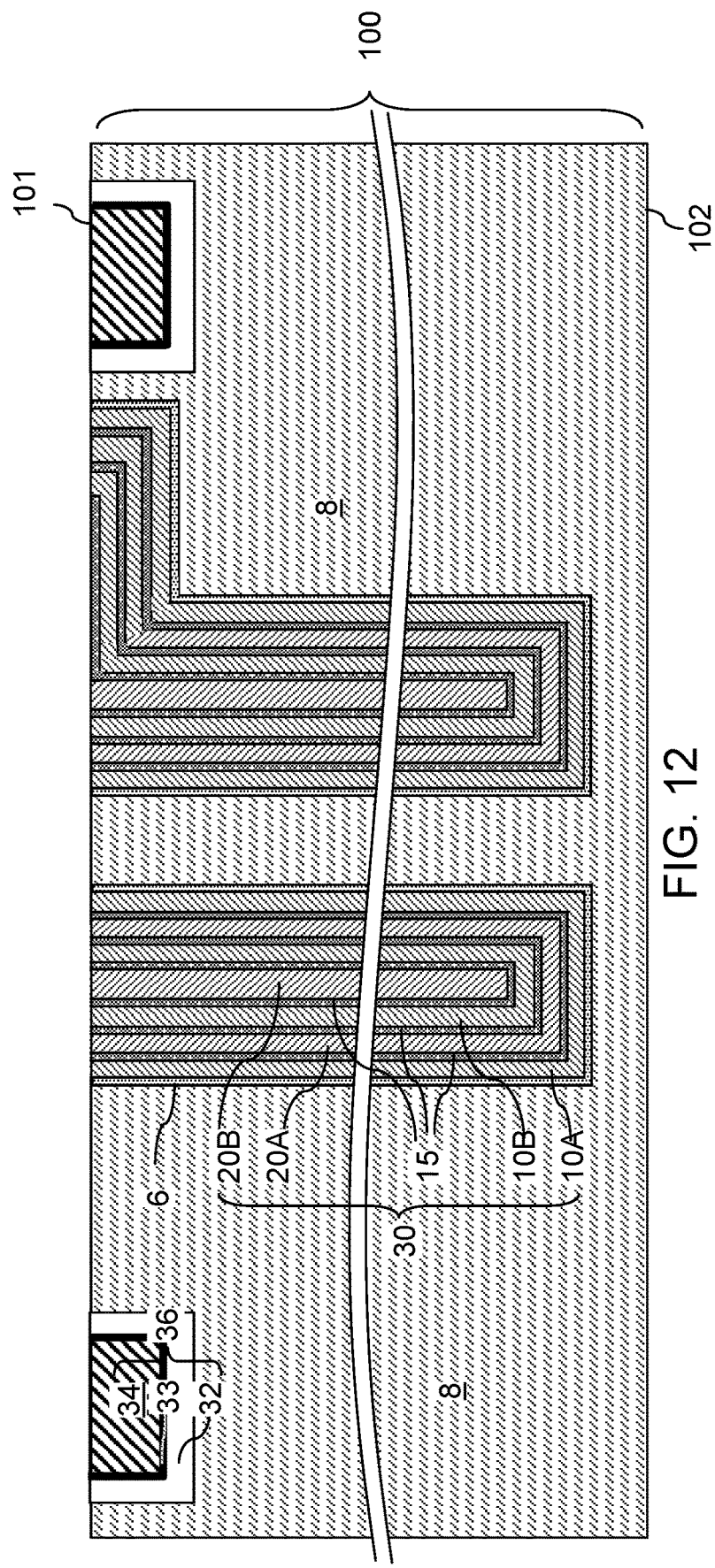
FIG. 12 is a vertical cross-sectional view of the second exemplary structure after formation an alternating layer stack including at least two first metallic electrode layers interlaced with at least one first node dielectric layer and first front-side metallic bonding pads according to an embodiment of the present disclosure.

Referring to FIG. 12, the processing steps of FIGS. 2-4 may be subsequently formed to form a first-tier capacitor assembly 100, which embeds at least one first deep trench capacitor. Generally, each first deep trench capacitor includes at least two first metallic electrode layers (10A, 10B, 20A, 20B) interlaced with at least one first node dielectric layer 15. The first metallic bonding pads (33, 34) may be located on, and underneath, the first front surface 101. In one embodiment, each layer within the first alternating layer stack 30 laterally surrounds, or is laterally surrounded by, any other layer within the first alternating layer stack 30.

The first-tier capacitor assembly 100 illustrated in FIG. 11 may be substantially the same as the first-tier capacitor assembly 100 of FIG. 4 by presence of at least one tab recess region in the first deep trenches 9 and laterally-extending portions of the first alternating layer stack 30. In one embodiment, at least one, and/or each, of the first metallic electrode layers (10A, 10B, 20A, 20B) comprises a respective laterally-extending portion that is formed in a tab recess region 9T. Each laterally-extending portion of a first metallic electrode layer (10A, 10B, 20A, 20B) is herein referred to as a tab portion.

In one embodiment, the height of a tab recess region 9T of a first deep trench 9 may be selected such that a horizontal surface of a horizontally-extending portion a first node dielectric layer 15 may be located within the horizontal plane including the first front surface 101. In one embodiment, a tab portion of the first primary metallic electrode layer 10A may contact a bottom surface of the horizontally-extending portion the first node dielectric layer 15 having a physically exposed horizontal surface. In one embodiment, a tab portion of the second primary metallic electrode layer 10B may contact a bottom surface of the horizontally-extending portion the first node dielectric layer 15 having a physically exposed horizontal surface. In one embodiment, a tab portion of the first secondary metallic electrode layer 20A may contact a bottom surface of the horizontally-extending portion the first node dielectric layer 15 having a physically exposed horizontal surface. In one embodiment, a tab portion of the second secondary metallic electrode layer 20B may contact a bottom surface of the horizontally-extending portion the first node dielectric layer 15 having a physically exposed horizontal surface. Generally, each of the first metallic electrode layers (10A, 10B, 20A, 20B) may have a tab portion that laterally extends horizontally and underlies, and contacts, a horizontally-extending portion of a first node dielectric layer 15 having a physically exposed surface.

Figure 13:
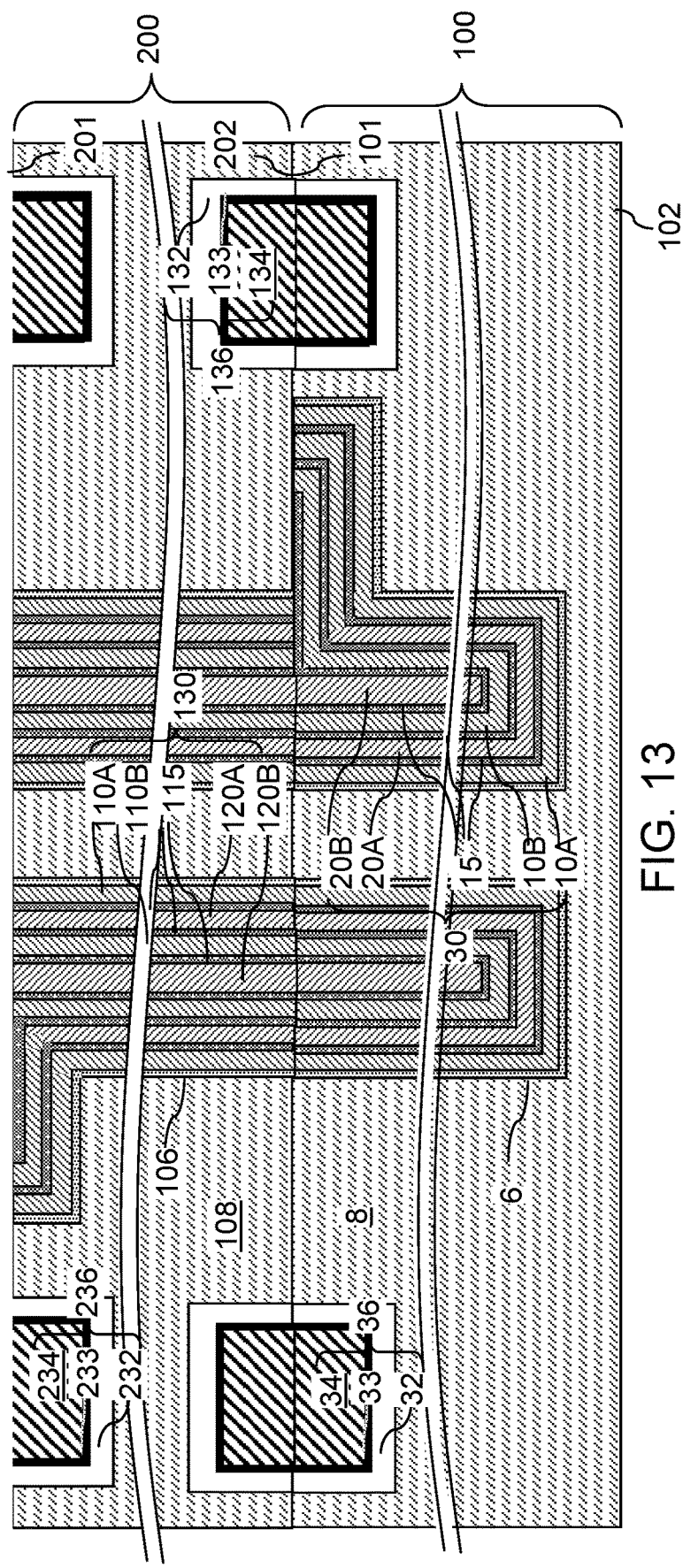
FIG. 13 is a vertical cross-sectional view of the second exemplary structure after formation of a second-tier capacitor assembly comprising a second substrate according to an embodiment of the present disclosure.

Referring to FIG. 13, a second-tier capacitor assembly 200 may be formed by performing a same set of processing steps that are employed to form the first-tier capacitor assembly 100 of FIG. 12 with a modification in the pattern of the tab recess regions 9T. The second-tier capacitor assembly 200 includes at least one second deep trench capacitor. The pattern of the second deep trench capacitors in the second-tier capacitor assembly 200 may be the same as the pattern of the first deep trench capacitors in the first-tier capacitor assembly 100. Each second deep trench capacitor includes a second alternating layer stack 130 of at least two second metallic electrode layers (110A, 110B, 120A, 120B) interlaced with at least one second node dielectric layer 115. For example, the second metallic electrode layers (110A, 110B, 120A, 120B) may include a first primary metallic electrode layer 110A, a first secondary metallic electrode layer 120A, a second primary metallic electrode layer 110B, a second secondary metallic electrode layer 120B, etc. The second metallic bonding pads (133, 134) may be located on, and underneath, a top surface of a second substrate 108, Each electrically-isolated bonding pad assembly 136 may include a respective second metallic bonding pad (133, 134) and a respective dielectric liner 132. In one embodiment, at least one, and/or each, of the second metallic electrode layers (110A, 110B, 120A, 120B) comprises a respective laterally-extending portion that is formed in a tab recess region. Each laterally-extending portion of a second metallic electrode layer (110A, 110B, 120A, 120B) is herein referred to as a tab portion. Areas of tab portions of the second metallic electrode layers (110A, 110B, 120A, 120B) may be laterally offset from, i.e., do not overlap with, areas of tab portions of the first metallic electrode layers (10A, 10B, 20A, 20B).

Electrically-isolated bonding pad assemblies 236 may be formed on, and underneath, the second front surface 201 of the second-tier capacitor assembly 200. Each electrically-isolated bonding pad assembly may include a respective third metallic bonding pad (233, 234) and a respective dielectric liner 232. Each third metallic bonding pad (233, 234) may include a metallic nitride liner 233 and a metal portion 234.

Figure 14:
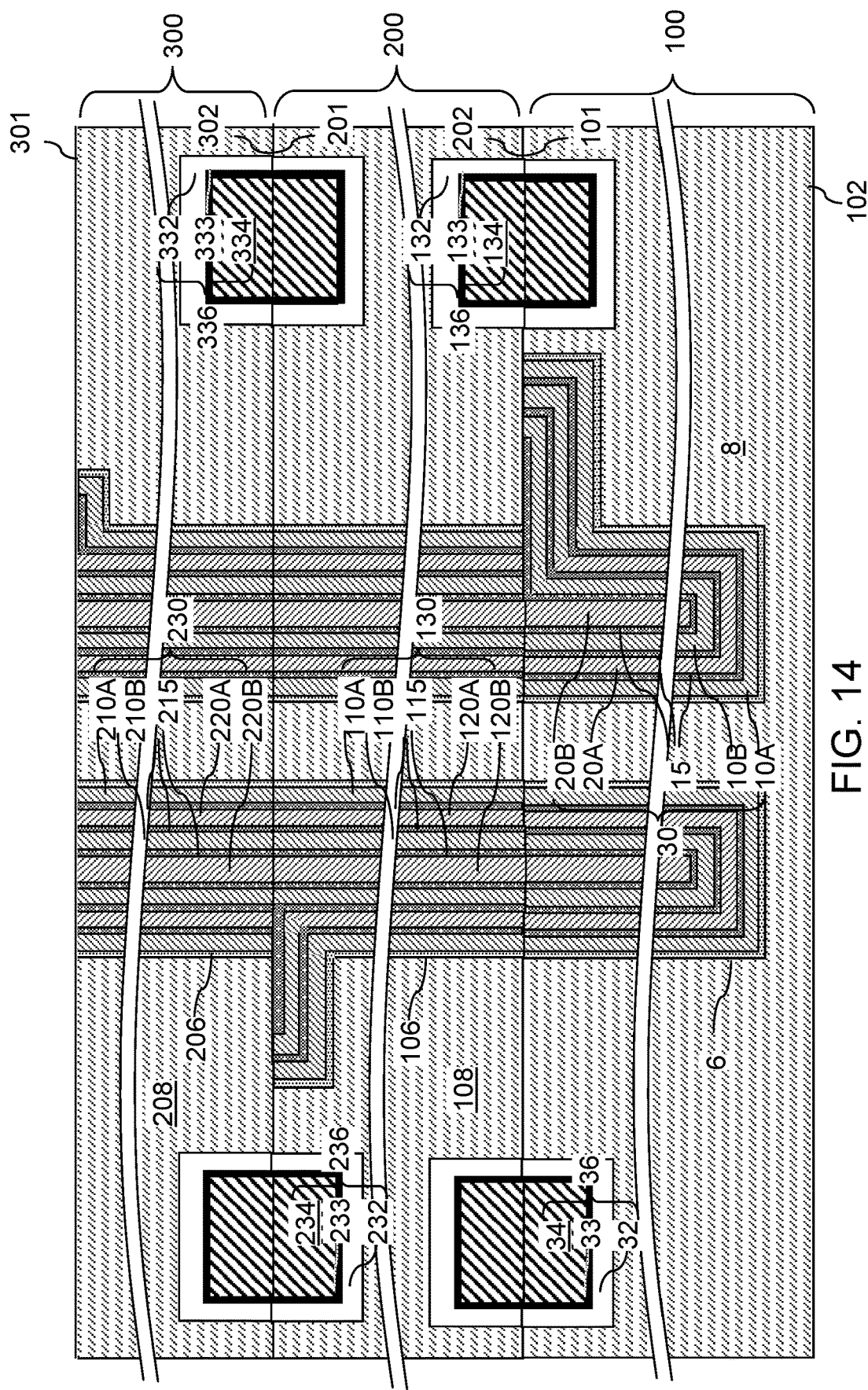
FIG. 14 is a vertical cross-sectional view of the second exemplary structure after formation of a third-tier capacitor assembly comprising a third substrate according to an alternative embodiment of the present disclosure.

Referring to FIG. 14, the processing steps of FIG. 10 may be performed mutatis mutandis to form a third-tier capacitor assembly 300. In one embodiment, at least one, and/or each, of the third metallic electrode layers (210A, 210B, 220A, 220B) comprises a respective laterally-extending portion that is formed in a tab recess region. Each laterally-extending portion of a third metallic electrode layer (210A, 210B, 220A, 220B) is herein referred to as a tab portion.

Figure 15:
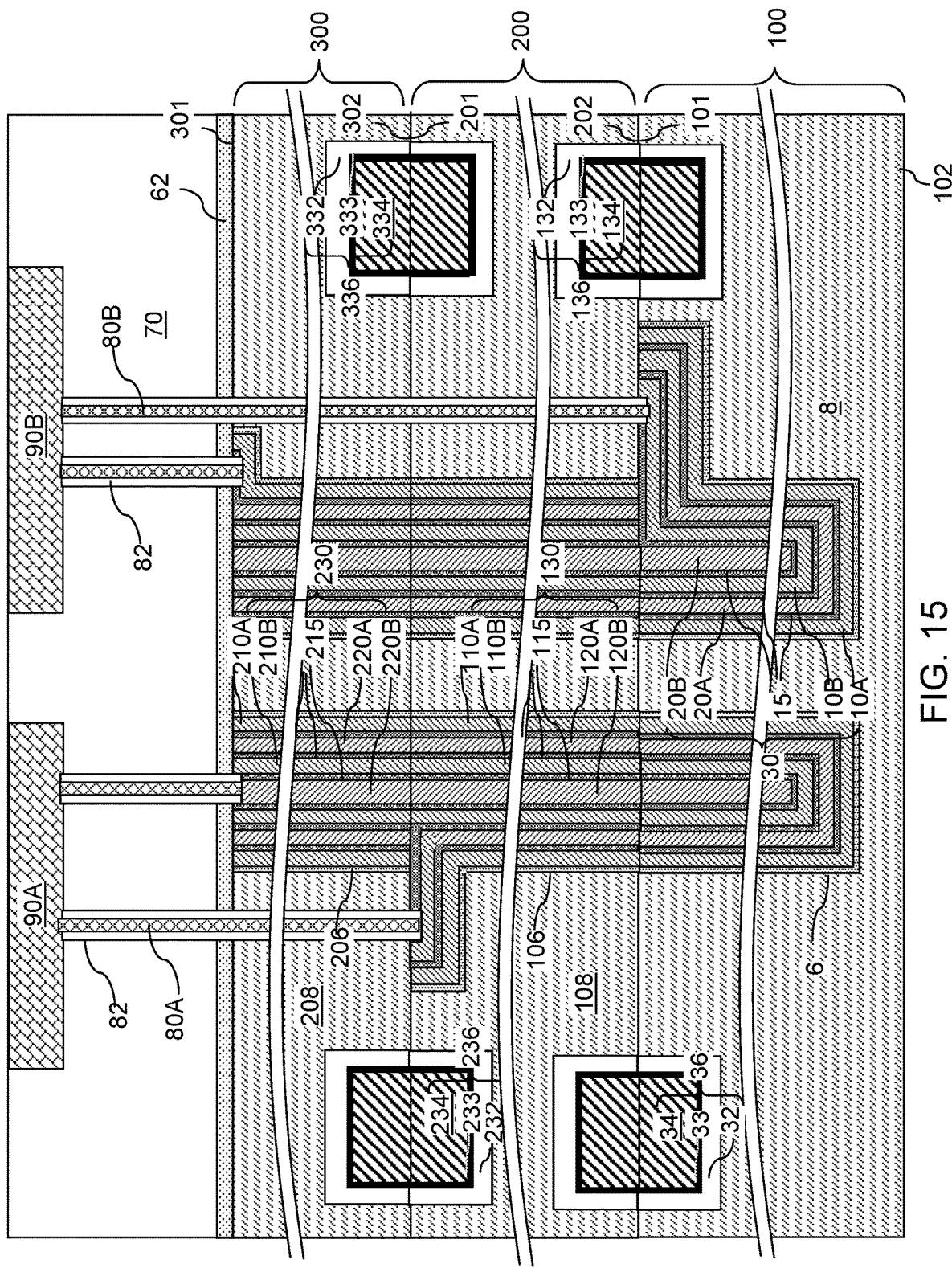
FIG. 15 is a vertical cross-sectional view of the second exemplary structure after formation of an interconnect-level dielectric layer and contact via structures according to an alternative embodiment of the present disclosure.

Referring to FIG. 15, an etch stop dielectric layer 62 may be deposited on the third front surface 301, and at least one interconnect-level dielectric layer 70 may be deposited over the etch stop dielectric layer 62. Metal interconnect structures (80A, 80B, 90A, 90B) may be formed in the at least one interconnect-level dielectric layer 70. The metal interconnect structures (80A, 80B, 90A, 90B) may include first contact via structures 80A contacting a first subset of the third metallic electrode layers (210A, 210B, 220A, 220B) and second contact via structures 80B contacting a second subset of the third metallic electrode layers (210A, 210B, 220A, 220B). Each of the contact via structures (80A, 80B) is electrically connected to a set of a respective one of the at least two first metallic electrode layers (10A, 10B, 20A, 20B), a respective one of the at least two second metallic electrode layers (110A, 110B, 120A, 120B), and a respective one of the at least two third metallic electrode layers (210A, 210B, 220A, 220B). The metal interconnect structures (80A, 80B, 90A, 90B) may include metallic bonding pads (90A, 90B), which may include a first metallic bonding pad 90A that is electrically connected to the first contact via structures 80A, and a second metallic bonding pad 90B that is electrically connected to the second contact via structures 80B.

In one embodiment, first via cavities may be formed through the at least one interconnect-level dielectric layer 70, the third substrate 208, and the second substrate 108 and onto a top surface of a tab portion of a respective first metallic electrode layer (10A, 10B, 20A, 20B). In one embodiment, second via cavities may be formed through the at least one interconnect-level dielectric layer 70 and the third substrate 208 and onto a top surface of a tab portion of a respective second metallic electrode layer (110A, 110B, 120A, 120B). In one embodiment, third via cavities may be formed through the at least one interconnect-level dielectric layer 70 and onto a top surface of a tab portion of a respective third metallic electrode layer (210A, 210B, 220A, 220B). The first via cavities, the second via cavities, and the third via cavities may be formed sequentially or simultaneously. The metallic electrode layers may be employed as etch stop layers during formation of the various via cavities. A conformal dielectric material layer may be deposited in the via cavities and may be anisotropically etched to form cylindrical dielectric spacers 82. The contact via structures (80A, 80B) may be formed in remaining volumes of the via cavities on a respective one of the metallic electrode layers.

Figure 16:
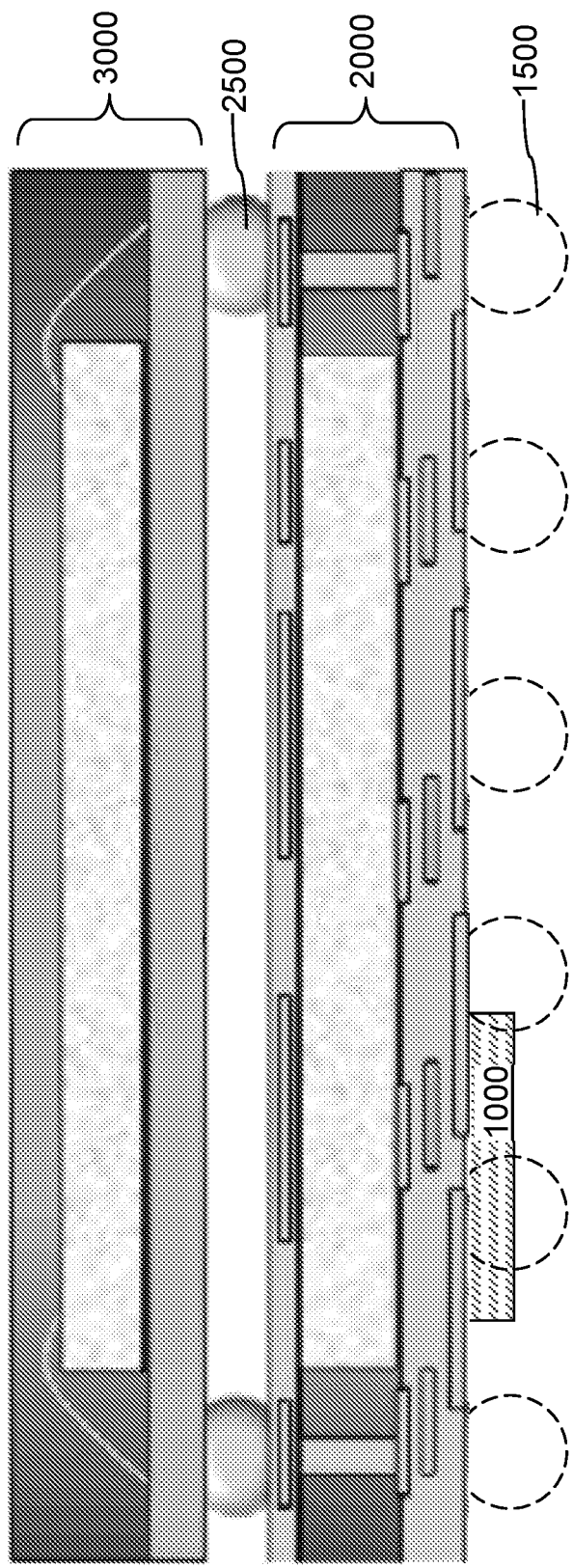
FIG. 16 is a vertical cross-sectional view of an exemplary chip assembly incorporating a semiconductor die containing a deep trench capacitor according to an embodiment of the present disclosure.

Referring to FIG. 16, a non-limiting exemplary application of the semiconductor die derived from the first exemplary structure is illustrated. A first semiconductor die 1000 may be provided by performing the processing steps of FIGS. 1-8B, FIGS. 1-7, 9, and 10, or FIGS. 11A-14. The first semiconductor die 1000 may be attached to the bottom side of a second semiconductor die 2000. For example, the second semiconductor die 2000 may be a system-on-a-chip (SoC) die 2000, which may be bonded to an integrated fan-out package on package (InFO PoP) die 3000 via an array of solder balls 2500. The second semiconductor die 2000 may be bonded to another module, such as a printed circuit board (PCB) via another array of solder balls 1500. The deep trench capacitor(s) in the semiconductor die 1000 may be employed to stabilize the power supply system in the second semiconductor die 2000.

Referring to all drawings and according to various embodiments of the present disclosure, a capacitor structure is provided, which comprises: a first-tier capacitor assembly 100 comprising a first substrate 8 having a first front surface 101 and a first backside surface 102 that are parallel to each other, a first alternating layer stack 30 embedded within the first substrate 8 and including at least two first metallic electrode layers (10A, 10B, 20A, 20B) interlaced with at least one first node dielectric layer 15, and first metallic bonding pads (33, 34) located on the first front surface 101; and a second-tier capacitor assembly 200 comprising a second substrate 108 having a second front surface 201 and a second backside surface 202 that are parallel to each other, a second alternating layer stack 130 embedded within the second substrate 108 and including at least two second metallic electrode layers (110A, 110B, 120A, 120B) interlaced with at least one second node dielectric layers 115, and second metallic bonding pads (133, 134) located on the second backside surface 202 and bonded to the first metallic bonding pads (33, 34); wherein each of the at least two first metallic electrode layers (10A, 10B, 20A, 20B) contacts a respective one of the at least two second metallic electrode layers (110A, 110B, 120A, 120B).

In one embodiment, the first front surface 101 contacts the second backside surface 202 within a horizontal plane in which the at least two second metallic electrode layers (110A, 110B, 120A, 120B) contact the at least two first metallic electrode layers (10A, 10B, 20A, 20B).

In one embodiment, each layer within the second alternating layer stack 130 continuously extends from the second front surface 201 to the second backside surface 202. In one embodiment, the first alternating layer stack 30 extends from the first front surface 101 into the first substrate 8 and has a first vertical extent less than a vertical distance between the first front surface 101 and the first backside surface 102. In one embodiment, the first vertical extent is in a range from 2 microns to 20 microns; and a vertical distance between the second front surface 201 and the second backside surface 202 is in a range from 2 microns to 20 microns.

In one embodiment, each of the at least two first metallic electrode layers (10A, 10B, 20A, 20B) and at least one first node dielectric layer 15 comprises a respective vertically extending portion that extends from the first front surface 101 toward the first backside surface 102; and each of the at least two second metallic electrode layers (110A, 110B, 120A, 120B) and at least one second node dielectric layers 115 comprises a respective vertically extending portion that extends from the second front surface 201 to the second backside surface 202.

In one embodiment, the capacitor structure comprises: an interconnect-level dielectric layer 70 overlying the second substrate 108; and contact via structures (80A, 80B) vertically extending through the interconnect-level dielectric layer 70 and electrically connected to a respective one of the at least two first metallic electrode layers (10A, 10B, 20A, 20B) and to a respective one of the at least two second metallic electrode layers (110A, 110B, 120A, 120B).

In one embodiment, the at least two first metallic electrode layers (10A, 10B, 20A, 20B) and the at least two second metallic electrode layers (110A, 110B, 120A, 120B) comprise a conductive metallic nitride, an elemental metal, or an intermetallic alloy; the at least one first node dielectric layer 15 and the at least one second node dielectric layer 115 comprise a dielectric metal oxide or silicon nitride; and the first substrate 8 and the second substrate 108 comprise semiconductor substrates.

In one embodiment, each layer within the first alternating layer stack 30 laterally surrounds, or is laterally surrounded by, any other layer within the first alternating layer stack 30; and each layer within the second alternating layer stack 130 laterally surrounds, or is laterally surrounded by, any other layer within the second alternating layer stack 130.

In one embodiment, the at least two first metallic electrode layers (10A, 10B, 20A, 20B) comprise at least three first metallic electrode layers (10A, 10B, 20A, 20B); the at least two second metallic electrode layers (110A, 110B, 120A, 120B) comprise at least three second metallic electrode layers (110A, 110B, 120A, 120B); the at least one first node dielectric layer 15 comprises at least two first node dielectric layers 15; and the at least one second node dielectric layer 115 comprise at least two second node dielectric layers 115.

According to another aspect of the present disclosure, a capacitor structure is provided, which comprises: a first-tier capacitor assembly 100 comprising a first substrate 8 having a first front surface 101 and a first backside surface 102 that are parallel to each other, and a first alternating layer stack 30 embedded within the first substrate 8 and including at least two first metallic electrode layers (10A, 10B, 20A, 20B) interlaced with at least one first node dielectric layer 15, wherein one of the at least two first metallic electrode layers (10A, 10B, 20A, 20B) comprises a tab portion that extend parallel to the first front surface 101; a second-tier capacitor assembly 200 comprising a second substrate 108 having a second front surface 201 and a second backside surface 202 that are parallel to each other, and a second alternating layer stack 130 embedded within the second substrate 108 and including at least two second metallic electrode layers (110A, 110B, 120A, 120B) interlaced with at least one second node dielectric layers 115; and a contact via structure (80A, 80B) vertically extending through the second substrate 108 and contacting a top surface of the tab portion of the one of the at least two first metallic electrode layers (10A, 10B, 20A, 20B).

In one embodiment, each of the at least two first metallic electrode layers (10A, 10B, 20A, 20B) contacts a respective one of the at least two second metallic electrode layers (110A, 110B, 120A, 120B) at an interface at which the first front surface 101 contacts the second backside surface 202.

In one embodiment, the capacitor structure comprises: first metallic bonding pads (33, 34) embedded in the first substrate 8; and second metallic bonding pads (133, 134) embedded in the second substrate 108 and bonded to a respective one of the first metallic bonding pads (33, 34) within a horizontal plane in which the first front surface 101 contacts the second backside surface 202 are located.

Figure 17:
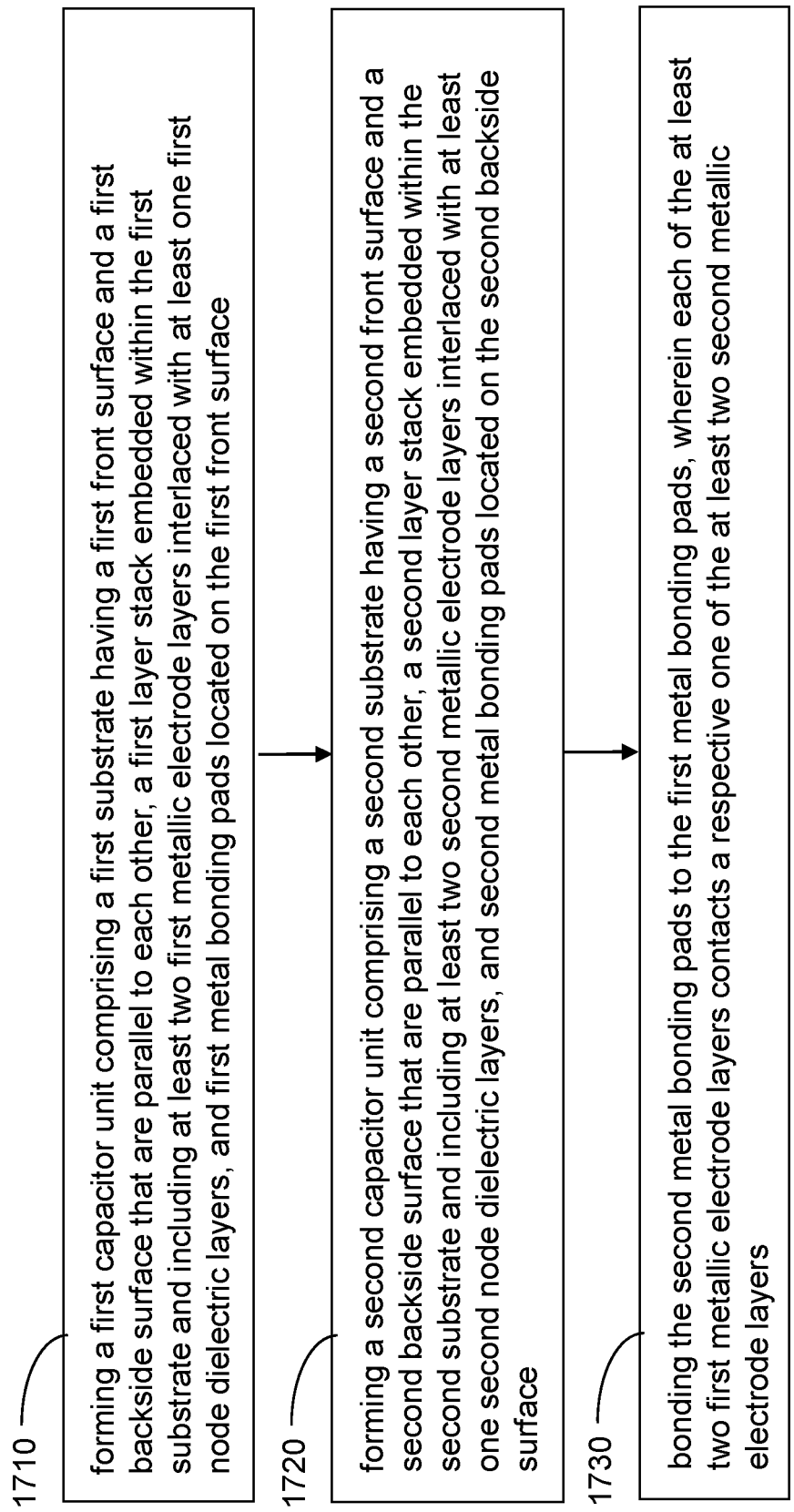
FIG. 17 is a flowchart that illustrates the general processing steps of the methods of the present disclosure.

FIG. 17 is a flowchart that illustrates the general processing steps of the methods for manufacturing a capacitor structure. Referring to step 1710 and FIGS. 1-4, 9, and 11A-12, a first-tier capacitor assembly 100 is formed, which comprises a first substrate 8 having a first front surface 101 and a first backside surface 102 that are parallel to each other, a first alternating layer stack 30 embedded within the first substrate 8 and including at least two first metallic electrode layers (10A, 10B, 20A, 20B) interlaced with at least one first node dielectric layer 15, and first metallic bonding pads (33, 34) located on the first front surface 101. Referring to step 1720 and FIGS. 5, 9, and 13, a second-tier capacitor assembly 200 may be formed, which comprises a second substrate 108 having a second front surface 201 and a second backside surface 202 that are parallel to each other, a second alternating layer stack 130 embedded within the second substrate 108 and including at least two second metallic electrode layers (110A, 110B, 120A, 120B) interlaced with at least one second node dielectric layers 115, and second metallic bonding pads (133, 134) located on the second backside surface 202. Referring to step 1730 and FIGS. 6, 7, 9, and 13, the second metallic bonding pads (133, 134) may be bonded to the first metallic bonding pads (33, 34). Each of the at least two first metallic electrode layers (10A, 10B, 20A, 20B) contacts a respective one of the at least two second metallic electrode layers (110A, 110B, 120A, 120B).

The various embodiments of the present disclosure may be employed to provide a multi-tier deep trench structure in which multiple capacitor assemblies (100, 200, 300) are vertically stacked. While the present disclosure is described employing embodiments in which two capacitor assemblies (100, 200) or three capacitor assemblies (100, 200, 300) are vertically stacked, embodiments are expressly contemplated herein in which four or more capacitor assemblies are vertically stacked. Stacking of the multiple capacitor assemblies may increase the total capacitance of a capacitor structure within a semiconductor die including the stack of multiple capacitor assemblies (100, 200, 300), and may be employed to provide a capacitor die having high capacitance within a limited area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure comprising:
a first-tier capacitor assembly comprising a first substrate having a first front surface and a first backside surface that are parallel to each other, a first alternating layer stack embedded within the first substrate and including at least two first metallic electrode layers interlaced with at least one first node dielectric layer, and first metallic bonding pads located on the first front surface; and
a second-tier capacitor assembly comprising a second substrate having a second front surface and a second backside surface that are parallel to each other, a second alternating layer stack embedded within the second substrate and including at least two second metallic electrode layers interlaced with at least one second node dielectric layer, and second metallic bonding pads located on the second backside surface and bonded to the first metallic bonding pads;
wherein each of the at least two first metallic electrode layers contacts a respective one of the at least two second metallic electrode layers.

2. The capacitor structure of claim 1, wherein the first front surface contacts the second backside surface within a horizontal plane in which the at least two second metallic electrode layers contact the at least two first metallic electrode layers.

3. The capacitor structure of claim 1, wherein each layer within the second alternating layer stack continuously extends from the second front surface to the second backside surface.

4. The capacitor structure of claim 3, wherein the first alternating layer stack extends from the first front surface into the first substrate and has a first vertical extent less than a vertical distance between the first front surface and the first backside surface.

5. The capacitor structure of claim 3, wherein:
the first vertical extent is in a range from 2 microns to 20 microns; and
a vertical distance between the second front surface and the second backside surface is in a range from 2 microns to 20 microns.

6. The capacitor structure of claim 1, wherein
each of the at least two first metallic electrode layers and at least one first node dielectric layer comprises a respective vertically extending portion that extends from the first front surface toward the first backside surface; and
each of the at least two second metallic electrode layers and at least one second node dielectric layers comprises a respective vertically extending portion that extends from the second front surface to the second backside surface.

7. The capacitor structure of claim 1, further comprising:
an interconnect-level dielectric layer overlying the second substrate; and contact via structures vertically extending through the interconnect-level dielectric layer and electrically connected to a respective one of the at least two first metallic electrode layers and to a respective one of the at least two second metallic electrode layers.

8. The capacitor structure of claim 1, wherein:
the at least two first metallic electrode layers and the at least two second metallic electrode layers comprise a conductive metallic nitride, an elemental metal, or an intermetallic alloy;
the at least one first node dielectric layer and the at least one second node dielectric layer comprise a dielectric metal oxide or silicon nitride; and
the first substrate and the second substrate comprise semiconductor substrates.

9. The capacitor structure of claim 1, wherein:
each layer within the first alternating layer stack laterally surrounds, or is laterally surrounded by, any other layer within the first alternating layer stack; and
each layer within the second alternating layer stack laterally surrounds, or is laterally surrounded by, any other layer within the second alternating layer stack.

10. The capacitor structure of claim 1, wherein:
the at least two first metallic electrode layers comprise at least three first metallic electrode layers;
the at least two second metallic electrode layers comprise at least three second metallic electrode layers;
the at least one first node dielectric layer comprises at least two first node dielectric layers; and
the at least one second node dielectric layer comprise at least two second node dielectric layers.

11. A capacitor structure comprising:
a first-tier capacitor assembly comprising a first substrate having a first front surface and a first backside surface that are parallel to each other, and a first alternating layer stack embedded within the first substrate and including at least two first metallic electrode layers interlaced with at least one first node dielectric layer, wherein one of the at least two first metallic electrode layers comprises a tab portion that extend parallel to the first front surface;
a second-tier capacitor assembly comprising a second substrate having a second front surface and a second backside surface that are parallel to each other, and a second alternating layer stack embedded within the second substrate and including at least two second metallic electrode layers interlaced with at least one second node dielectric layer; and
a contact via structure vertically extending through the second substrate and contacting a top surface of the tab portion of the one of the at least two first metallic electrode layers, wherein each of the at least two first metallic electrode layers contacts a respective one of the at least two second metallic electrode layers at an interface at which the first front surface contacts the second backside surface.

12. The capacitor structure of claim 11, further comprising:
first metallic bonding pads embedded in the first substrate; and
second metallic bonding pads embedded in the second substrate and bonded to a respective one of the first metallic bonding pads within a horizontal plane in which the first front surface contacts the second backside surface are located.

13. A capacitor structure comprising:
a first-tier capacitor assembly comprising a first semiconductor substrate having a first front surface and a first backside surface that are parallel to each other, and a first alternating layer stack embedded within the first semiconductor substrate and including at least two first metallic electrode layers interlaced with at least one first node dielectric layer, wherein one of the at least two first metallic electrode layers comprises a tab portion that extend parallel to the first front surface, and wherein a vertical extent of the first alternating layer stack is less than a thickness of the first semiconductor substrate along a vertical direction;
a second-tier capacitor assembly comprising a second semiconductor substrate having a second front surface and a second backside surface that are parallel to each other, and a second alternating layer stack embedded within the second semiconductor substrate and including at least two second metallic electrode layers interlaced with at least one second node dielectric layer, wherein a vertical extent of the second alternating stack is the same as a thickness of the second semiconductor substrate along the vertical direction; and
a contact via structure vertically extending through the second semiconductor substrate and contacting a top surface of the tab portion of the one of the at least two first metallic electrode layers.

14. The semiconductor structure of claim 13, further comprising a third-tier capacitor assembly overlying the second-tier capacitor assembly and comprising a third semiconductor substrate having a first front surface and a third backside surface that are parallel to each other, and a third alternating layer stack embedded within the third semiconductor substrate and including at least two third metallic electrode layers interlaced with at least one third node dielectric layer, wherein a vertical extent of the third alternating stack is the same as a thickness of the third semiconductor substrate along the vertical direction.

15. The semiconductor structure of claim 14, wherein the contact via structure vertically extending through the third semiconductor substrate.

16. The semiconductor structure of claim 14, further comprising at least one interconnect-level dielectric layer overlying the third-tier capacitor assembly, wherein the contact via structure vertically extends through a lower portion of the at least one interconnect-level dielectric layer.

17. The semiconductor structure of claim 16, wherein one of the at least two third metallic electrode layers comprises a tab portion that extend parallel to the third front surface, and wherein the vertical extent of the tap portion is less than the thickness of the third semiconductor substrate.

18. The semiconductor structure of claim 17, further comprising:
an additional contact via structure vertically extending through the lower portion of the at least one interconnect-level dielectric layer and contacting the tap portion of said one of the at least two third metallic electrode layers; and
a metallic bonding pads embedded in an upper portion of the at least one interconnect-level dielectric layer and contacting top surfaces of the contact via structure and the additional contact via structure.

19. The semiconductor structure of claim 13, further comprising:

first electrically-isolated bonding pad assemblies embedded in an upper portion of the first semiconductor substrate and comprising a respective first metallic bonding pad; and second electrically-isolated bonding pad assemblies embedded in a lower portion of the second semiconductor substrate and comprising a respective second metallic bonding pad that is bonded to a respective one of the first metallic bonding pads of the first electrically-isolated bonding pad assemblies through metal-to-metal bonding.

20. The capacitor structure of claim 11, wherein each layer within the second alternating layer stack continuously extends from the second front surface to the second backside surface.

* * * * *